(12) United States Patent
Liu et al.

(10) Patent No.: US 12,490,593 B2
(45) Date of Patent: Dec. 2, 2025

(54) DISPLAY PANEL AND MANUFACTURING METHOD THEREFOR, DISPLAY SUBSTRATE AND MANUFACTURING METHOD THEREFOR, AND DISPLAY APPARATUS

(71) Applicant: BOE TECHNOLOGY GROUP CO., LTD., Beijing (CN)

(72) Inventors: Libin Liu, Beijing (CN); Shiming Shi, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 675 days.

(21) Appl. No.: 17/777,652

(22) PCT Filed: May 13, 2021

(86) PCT No.: PCT/CN2021/093582
§ 371 (c)(1),
(2) Date: May 18, 2022

(87) PCT Pub. No.: WO2021/244248
PCT Pub. Date: Dec. 9, 2021

(65) Prior Publication Data
US 2023/0006009 A1    Jan. 5, 2023

(30) Foreign Application Priority Data
Jun. 4, 2020 (CN) .......................... 202010501773.3

(51) Int. Cl.
*H10K 59/122* (2023.01)
*H10K 50/844* (2023.01)
*H10K 59/123* (2023.01)
*H10K 59/131* (2023.01)
*H10K 59/80* (2023.01)
*H10K 71/16* (2023.01)
*H10K 59/12* (2023.01)

(52) U.S. Cl.
CPC ......... *H10K 59/122* (2023.02); *H10K 50/844* (2023.02); *H10K 59/123* (2023.02);
(Continued)

(58) Field of Classification Search
CPC ............... H10K 59/122; H10K 50/844; H10K 59/1201; H10K 59/123; H10K 59/131; H10K 71/166; H10K 50/11
See application file for complete search history.

(56) References Cited

U.S. PATENT DOCUMENTS 9,093,669 B2 * 7/2015 Park ..................... H10K 59/122
2009/0009069 A1 * 1/2009 Takata ................. H10K 59/122
445/24
(Continued)

FOREIGN PATENT DOCUMENTS

CN    101626029 A    1/2010
CN    103219354 A    7/2013
(Continued)

OTHER PUBLICATIONS

First Office Action of Priority Application No. CN 202010501773.3 issued by the Chinese Patent Office on Jun. 30, 2022.

*Primary Examiner* — Jeff W Natalini
*Assistant Examiner* — Brandon C Fox
(74) *Attorney, Agent, or Firm* — XSENSUS LLP

(57) ABSTRACT

A display panel includes: a base, a first electrode, a pixel definition layer and a first light-emitting functional layer. The first electrode is disposed on a side of the base; the pixel definition layer is disposed on the side of the base, and includes a first hollowed-out portion; the first hollowed-out portion includes a first opening and a second opening arranged oppositely, the first opening is closer to the base than the second opening, and the first opening exposes at least part of the first electrode; and the first light-emitting
(Continued)

functional layer is disposed on sides of the pixel definition layer and the first electrode away from the base, and includes a second hollowed-out portion; an orthogonal projection of the second hollowed-out portion on the base is non-overlapping with an orthogonal projection of the first opening on the base.

20 Claims, 26 Drawing Sheets

(52) U.S. Cl.
CPC ......... *H10K 59/131* (2023.02); *H10K 59/873* (2023.02); *H10K 71/166* (2023.02); H10K 59/1201 (2023.02)

(56) References Cited

U.S. PATENT DOCUMENTS

| | | |
|---|---|---|
| 2010/0007271 A1 | 1/2010 | Lee et al. |
| 2013/0187163 A1 | 7/2013 | Kim et al. |
| 2014/0084257 A1 | 3/2014 | Kim et al. |
| 2017/0179420 A1* | 6/2017 | Lee ...................... H10K 71/166 |
| 2017/0186831 A1* | 6/2017 | Nam ..................... H01L 23/544 |
| 2019/0067390 A1* | 2/2019 | Gao ..................... H10K 59/1315 |
| 2019/0237525 A1 | 8/2019 | Zhao et al. |
| 2019/0237703 A1* | 8/2019 | Kim ................... H10K 59/8731 |
| 2021/0126228 A1 | 4/2021 | You et al. |
| 2021/0167025 A1 | 6/2021 | Zhang et al. |
| 2021/0335828 A1 | 10/2021 | Chen |
| 2022/0068177 A1 | 3/2022 | Liu et al. |
| 2025/0212621 A1* | 6/2025 | Gao ................... H10K 59/1201 |

FOREIGN PATENT DOCUMENTS

| | | | | |
|---|---|---|---|---|
| CN | 206250196 U | | 6/2017 | |
| CN | 107240599 A | | 10/2017 | |
| CN | 108321175 A | | 7/2018 | |
| CN | 110112175 A | | 8/2019 | |
| CN | 110706655 A | * | 1/2020 | ............ G09F 9/301 |
| CN | 110707095 A | | 1/2020 | |
| CN | 110911466 A | | 3/2020 | |
| CN | 111628105 A | | 9/2020 | |

* cited by examiner

DISPLAY PANEL AND MANUFACTURING METHOD THEREFOR, DISPLAY SUBSTRATE AND MANUFACTURING METHOD THEREFOR, AND DISPLAY APPARATUS

CROSS-REFERENCE TO RELATED APPLICATIONS

The present disclosure is a national phase entry under 35 USC 371 of International Patent Application No. PCT/CN2021/093582, filed on May 13, 2021, which claims priority to Chinese Patent Application No. 202010501773.3, filed on Thursday, Jun. 4, 2020, which are incorporated herein by reference in their entirety.

TECHNICAL FIELD

The present disclosure relates to the field of display technologies, and in particular, to a display panel and a manufacturing method therefor, a display substrate and a manufacturing method therefore, and a display apparatus.

BACKGROUND

Organic light-emitting diodes (OLED) are organic thin film electroluminescence devices, and are commonly used in display apparatuses. The OLED display apparatuses have the advantages such as self-luminescence, high luminous efficiency, short response time, high definition and contrast, and can realize flexible display, so that the OLED display apparatuses are used in more and more occasions.

SUMMARY

In an aspect, a display panel is provided. The display panel includes a base, a first electrode, a pixel defining layer and a first light-emitting functional layer.

The first electrode is disposed on a side of the base.

The pixel defining layer is disposed on the side of the base, and includes a first hollowed-out portion. The first hollowed-out portion includes a first opening and a second opening that are arranged oppositely; the first hollowed-out portion is closer to the base than the second opening, and the first opening exposes at least part of the first electrode.

The first light-emitting functional layer is disposed on sides of the pixel defining layer and the first electrode away from the base, and includes a second hollowed-out portion. An orthogonal projection of the second hollowed-out portion on the base is non-overlapping with an orthogonal projection of the first opening on the base.

In some embodiments, the orthogonal projection of the second hollowed-out portion on the base and the orthogonal projection of the second opening on the base have a gap therebetween.

In some embodiments, a maximum size of the second hollowed-out portion is smaller than a maximum size of the first hollowed-out portion.

In some embodiments, the display panel further includes a second electrode disposed on a side of the first light-emitting functional layer away from the base, and the second electrode covers the second hollowed-out portion.

In some embodiments, the display panel further includes a thin film transistor disposed between the base and the first electrode, and including a source and a drain. The source or the drain of the thin film transistor is electrically connected to the first electrode.

In some embodiments, the thin film transistor further includes: a portion of each of an active layer, a first gate insulating layer, a gate layer, a second gate insulating layer, and an interlayer insulating layer that are stacked in a direction moving away from the base; the source and the drain of the thin film transistor are arranged on a side of the interlayer insulating layer away from the base, and are in contact with the active layer through via holes passing through the interlayer insulating layer, the second gate insulating layer and the first gate insulating layer.

In some embodiments, the display panel further includes a first metal layer disposed between the thin film transistor and the base. The first metal layer is configured to be electrically connected to a compensation voltage terminal, and the compensation voltage terminal is configured to provide a compensation voltage signal for compensating a threshold voltage of the thin film transistor.

In some embodiments, the display panel further includes an encapsulation layer. The encapsulation layer includes a first inorganic encapsulation sub-layer, an organic encapsulation sub-layer, and a second inorganic encapsulation sub-layer that are stacked in a direction of moving away from the base.

In another aspect, a display substrate is provided. The display substrate includes a base, a first electrode, a pixel defining layer, a sacrifice pattern, a spacer and a second light-emitting functional layer.

The first electrode is disposed on a side of the base.

The pixel defining layer is disposed on the side of the base, and includes a first hollowed-out portion. The first hollowed-out portion includes a first opening and a second opening that are arranged oppositely; the first opening is closer to the base than the second opening, and the first opening exposes at least part of the first electrode.

The sacrifice pattern is disposed on aside of the pixel definition layer away from the base, and an orthogonal projection of the sacrifice pattern on the base being non-overlapping with an orthogonal projection of the first opening on the base.

The spacer is disposed on a side of the sacrifice pattern away from the base, and an orthogonal projection of the spacer on the base being non-overlapping with the orthogonal projection of the first opening on the base.

The second light-emitting functional layer is disposed on sides of the pixel definition layer and the first electrode away from the base.

In some embodiments, the spacer includes a first surface and a second surface that are arranged oppositely in a direction moving away from the base, and the first surface is closer to the base than the second surface; an orthogonal projection of the first surface on the pixel-defining layer is located within an orthogonal projection of the second surface on the pixel-defining layer, and a border of the orthogonal projection of the first surface on the pixel defining layer and a border of the orthogonal projection of the second surface on the pixel defining layer have a gap therebetween.

In some embodiments, a maximum size of the second hollowed-out portion is smaller than a maximum size of the first hollowed-out portion.

In some embodiments, the orthogonal projection of the spacer on the base and an orthogonal projection of the second opening on the base have a gap therebetween.

In some embodiments, a thickness of the sacrifice pattern is greater than a thickness of the second light-emitting functional layer.

In some embodiments, the display substrate further includes a thin film transistor disposed between the base and the first electrode, and including a source and a drain. The source or the drain of the thin film transistor is electrically connected to the first electrode.

In yet another aspect, a display apparatus is provided. The display apparatus includes the display panel described above.

In yet another aspect, a manufacturing method for a display substrate is provided. The method includes:
forming a first electrode on a base;
forming a pixel defining layer on the base on which the first electrode is formed; the pixel defining layer including a first hollowed-out portion, and the first hollowed-out portion including a first opening and a second opening that are arranged oppositely; the first opening being closer to the base than the second opening, and the first opening exposing at least part of the first electrode;
forming a sacrifice pattern and a spacer that are stacked on the pixel defining layer, the sacrifice pattern being closer to the base than the spacer;
providing a mask opposite to the base on which the spacer is formed, the spacer being in contact with the mask; and evaporating a light-emitting functional material onto a side, on which the spacer is formed, of the base through the mask to form a second light-emitting functional layer.

In some embodiments, forming the sacrifice pattern and the spacer that are stacked on the pixel defining layer includes: forming a first film on the base on which the pixel defining layer is formed, and patterning the first film to form the sacrifice pattern on a side of the pixel defining layer away from the base; and
forming a second film on the base on which the sacrifice pattern is formed, and patterning the second film to form the spacer on a side of the sacrifice pattern away from the base.

In some other embodiments, forming the sacrifice pattern and the spacer that are stacked on the pixel defining layer includes: forming a first film on the base on which the pixel defining layer is formed;
forming a second thin film on the first film; and
patterning the first film and the second film simultaneously to form the sacrifice pattern and the spacer that are stacked.

In yet another aspect, a manufacturing method for a display panel is provided.

The method includes:
the manufacturing method for the display substrate as above; and
removing the sacrifice pattern in the display substrate, so that the spacer, located on a side of the sacrifice pattern away from the base, in the display substrate is detached from the display substrate to form a first light-emitting functional layer through the second light-emitting functional layer.

In some embodiments, the manufacturing method for the display panel further includes:
forming a second electrode on the base on which the first light-emitting functional layer is formed;
forming a first inorganic encapsulation sub-layer on the second electrode;
forming an organic encapsulation sub-layer on the first inorganic encapsulation; and
forming a second inorganic encapsulation sub-layer on the organic encapsulation sub-layer, the first inorganic encapsulation sub-layer, the organic encapsulation sub-layer and the second inorganic encapsulation sub-layer constituting an encapsulation layer.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1A:
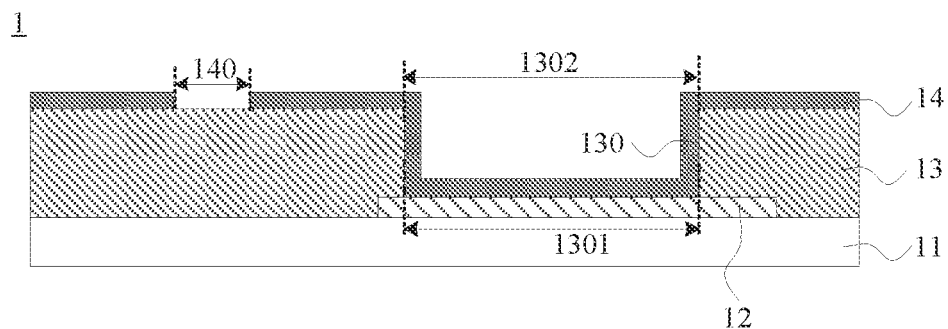
FIGS. 1A to 1G are structural diagrams of display panels, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive sense, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, a feature defined with the term such as "first" or "second" may explicitly or implicitly include one or more features. In the description of the embodiments of the present disclosure, the term "a plurality of/the plurality of" means two or more unless otherwise specified.

In the description of some embodiments, terms such as "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is, optionally, construed to mean "when" or "upon" or "in response to determining" or "in response to detecting", depending on the context. Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The use of the phase "applicable to" or "configured to" herein means an open and inclusive language, which does not exclude devices that are applicable to or configured to perform additional tasks or steps.

Additionally, the use of the phase "based on" is meant to be open and inclusive, since a process, step, calculation or other action that is "based on" one or more of the stated conditions or values may, in practice, be based on additional conditions or value beyond those stated.

As used herein, the terms such as "about" or "approximately" include a stated value and an average value within an acceptable range of deviation of a particular value. The acceptable range of deviation is determined by a person of ordinary skill in the art, in consideration of measurement in question and errors associated with the measurement of a particular quantity (i.e., limitations of a measurement system).

Exemplary embodiments are described herein with reference to sectional views and/or plan views as idealized exemplary drawings. In the accompanying drawings, thickness of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Embodiments of the present disclosure provide a display apparatus, and the display apparatus may be an electroluminescent display apparatus.

In some embodiments, the electroluminescent display apparatus includes, for example, a display panel. The display panel may be, for example, an organic light-emitting diode (OLED) display panel or a quantum dot light-emitting diodes (OLED) display panel.

Referring to FIGS. 1A to 1G, the display panel 1 includes, for example, a base 11, at least one first electrode 12, a pixel defining layer 13, and a first light-emitting functional layer 14.

The base 11 may be a flexible base, and a material of the flexible base is, for example, polyimide (PI).

The at least one first electrode 12 is disposed on a side of the base 11. The first electrode 12 is, for example, a transparent electrode, or an anode, and a material thereof includes, for example, indium tin oxide (ITO). In some embodiments, there are a plurality of first electrodes 12.

The pixel defining layer 13 is disposed on the side of the base 11, and includes at least one first hollowed-out portion 130. The first hollowed-out portion 130 includes a first opening 1301 and a second opening 1302 that are arranged oppositely. The first opening 1301 is closer to the base 11 than the second opening 1302, and the first opening 1301 exposes at least part of the first electrode 12.

In some embodiments, referring to FIGS. 1A to 1E, a size of the first opening 1301 and a size of the second opening 1302 are exactly the same, and the size here includes, for example, a length and a width.

Figure 1B:
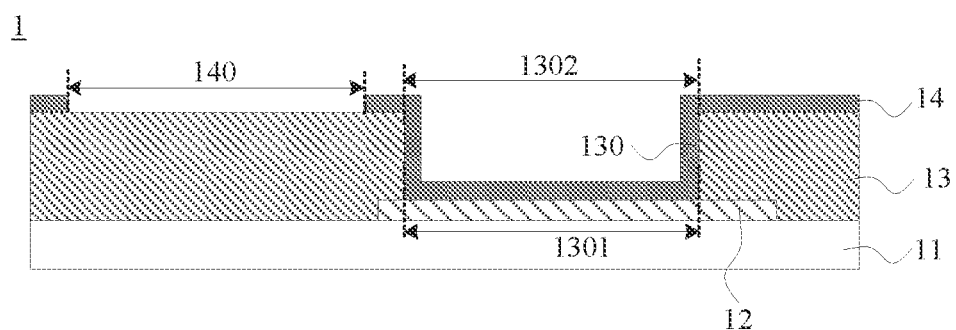
Figure 1C:
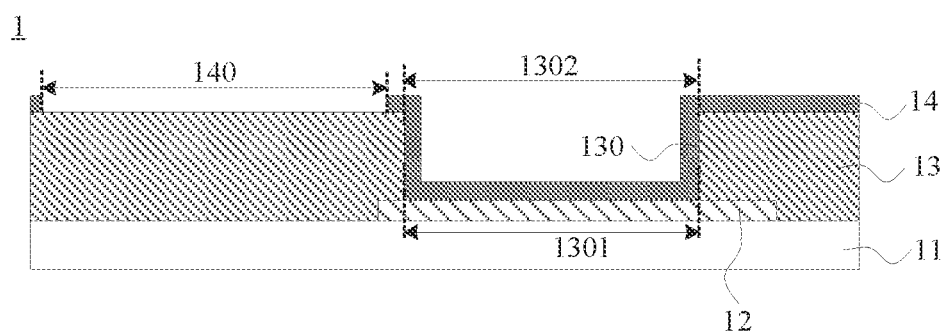
Figure 1D:
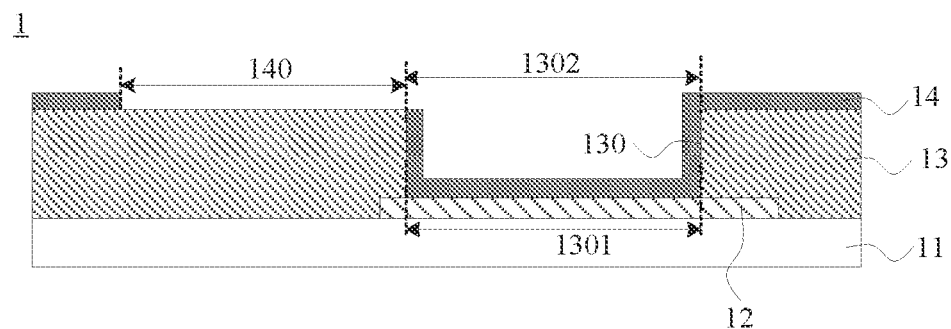
Figure 1E:
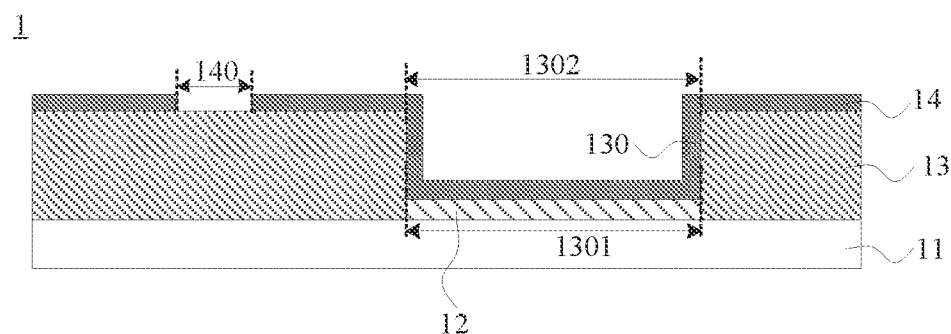
Figure 1F:
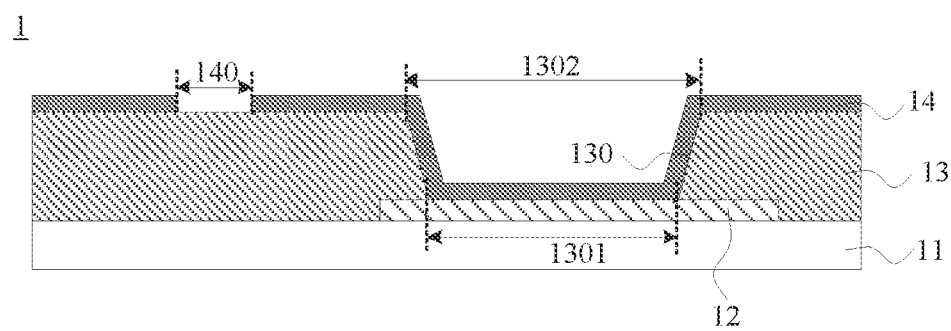
Figure 1G:
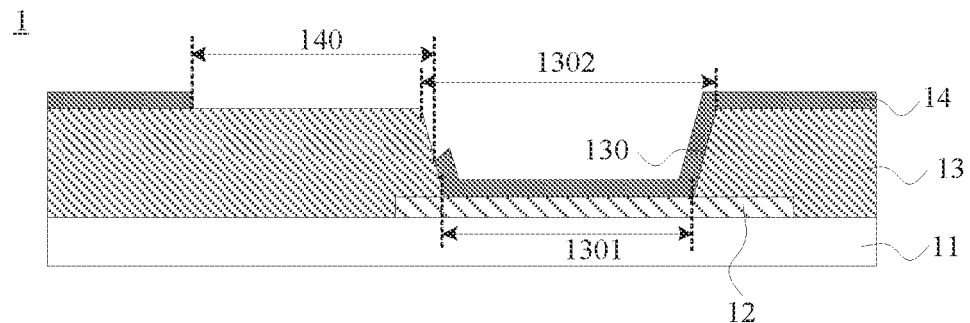

In some other embodiments, referring to FIGS. 1F and 1G, the size of the first opening 1301 and the size of the second opening 1302 are different, for example, at least one of the length and the width is different.

In some embodiments, the number of the first hollowed-out portions 130 is, for example, greater than or equal to the number of the first electrodes 12, and the redundant first hollowed-out portions 130 are used, for example, to achieve electrical connection between film layers that are separated by layer(s) in the display panel 1.

In some embodiments, referring to FIGS. 1A to 1D, 1F and 1G, the first hollowed-out portion 130 exposes a portion of a surface of the first electrode 12 away from the base 11.

In some other embodiments, referring to FIG. 1E, the first hollowed-out portion 130 exposes an entire surface of the first electrode 12 away from the base 11.

The first light-emitting functional layer 14 is disposed on sides of the pixel defining layer 13 and the first electrode 12 away from the base 11, and includes a second hollowed-out portion 140. An orthogonal projection of the second hollowed-out portion 140 on the base 11 is non-overlapping with an orthogonal projection of the first opening 1301 on the base 11.

The first light-emitting functional layer 14 includes at least a light-emitting layer.

A material of the light-emitting layer may include, for example, an organic electroluminescent material.

Figure 2:
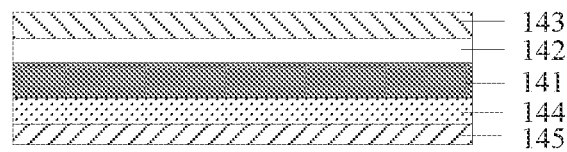
FIG. 2 is a structural diagram of a first light-emitting functional layer, in accordance with some embodiments of the present disclosure.

As shown in FIG. 2, in addition to the light-emitting layer 141, the first light-emitting functional layer 14 may further includes an electron transporting layer (ETL) 142, an electron injection layer (EIL) 143, a hole transporting layer (HTL) 144 and a hole injection layer (HIL) 145. It will be noted that the first light-emitting functional layer 14 is not limited to include only a combination of the light-emitting layer 141, the ETL 142, the EIL 143, the HTL 144 and the HIL 145, and may include other functional layers.

The description that "the orthogonal projection of the second hollowed-out portion 140 on the base 11 is non-overlapping with the orthogonal projection of the first opening 1301 on the base 11" includes following cases.

Referring to FIGS. 1A to 1C, 1E and 1F, in a direction perpendicular to a thickness direction of the base 11 (the thickness direction of the base 11 is a direction perpendicular to one side of the base 11 and the other side of the base 11), the orthogonal projection of the second hollowed-out portion 140 on the base 11 and an orthogonal projection of the first opening 1301 on the base 11 have a gap therebetween, and the gap is located in an orthogonal projection of the first light-emitting functional layer 14 on the base 11.

Referring to FIG. 1D, in the direction perpendicular to the thickness direction of the base 11, the orthogonal projection of the second hollowed-out portion 140 on the base 11 is adjacent to the orthogonal projection of the first opening 1301 on the base 11, that is, there is no gap between the orthogonal projection of the second hollowed-out portion 140 on the base 11 and the orthogonal projection of the first opening 1301 on the base 11. Moreover, the orthogonal projection of the second hollowed-out portion 140 on the base 11 is also adjacent to an orthogonal projection of the second opening 1302 on the base 11.

Referring to FIG. 1G, in the direction perpendicular to the thickness direction of the base 11, there is a gap between the orthogonal projection of the second hollowed-out portion 140 on the base 11 and the orthogonal projection of the first opening 1301 on the base 11, and moreover, the orthogonal projection of the second hollowed-out portion 140 on the base 11 partially overlaps the orthogonal projection of the second opening 1302 on the base 11.

When manufacturing the first light-emitting functional layer 14, a fine metal mask (FFM) needs to be used to evaporate a material for forming the first light-emitting functional layer 14, but in order to avoid scratches made by FFM on film layers (e.g., the pixel defining layer 13 and the first electrode 12) which have been manufactured before the first light-emitting functional layer 14 is manufactured, spacer(s) 17 may be provided on the pixel defining layer 13 to support the FMM, so that there is a certain distance between the FMM and the manufactured film layers, and the FMM is not in direct contact with the film layers, so as to protect the manufactured film layers.

Figure 3A:
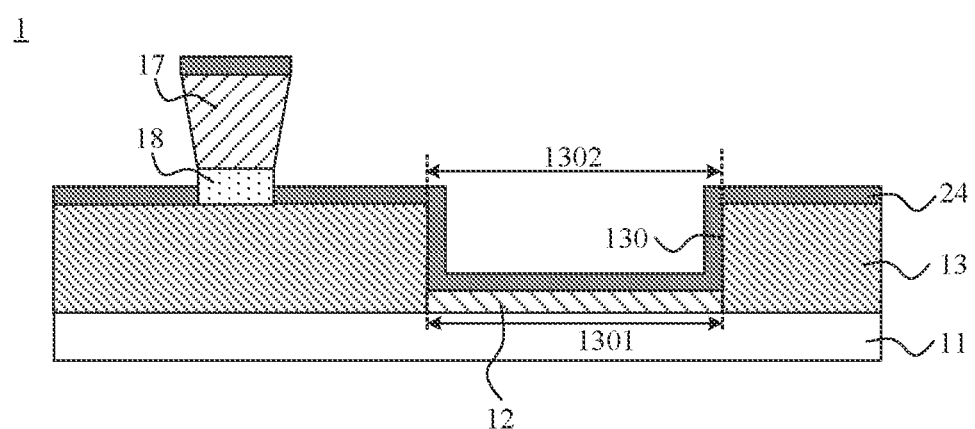
FIGS. 3A to 3C are diagrams illustrating a manufacturing process for a display panel, in accordance with some embodiments of the present disclosure.
Figure 3B:
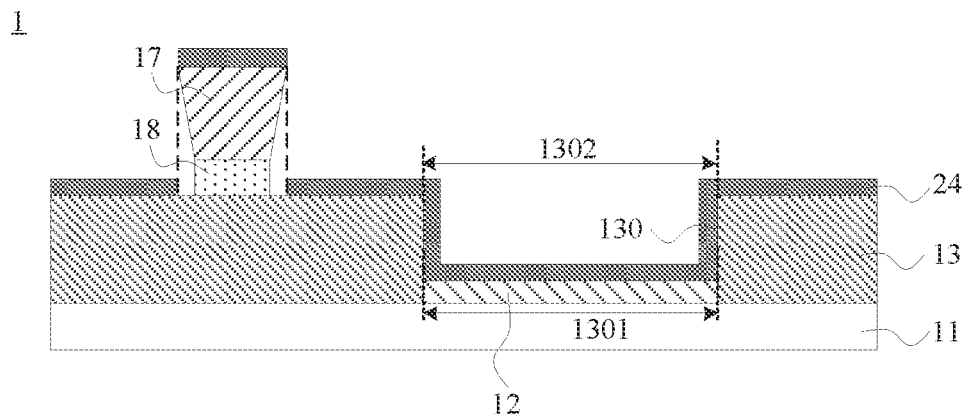
Figure 3C:
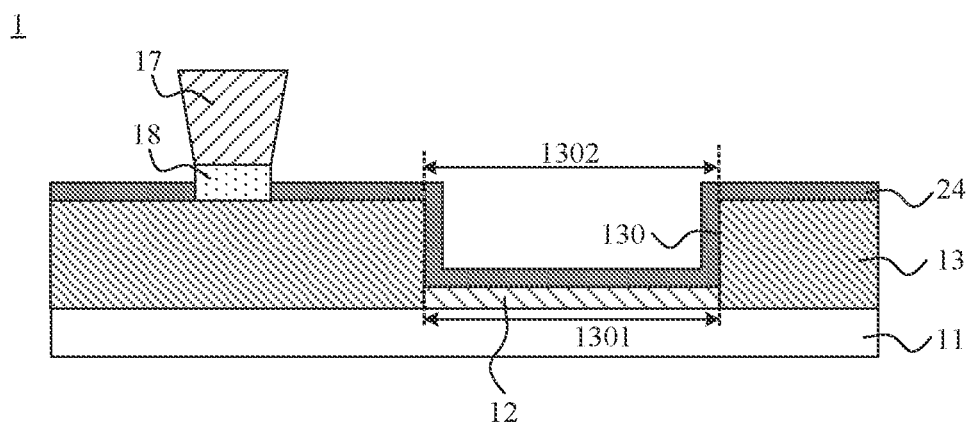

Referring to FIGS. 3A to 3C, in a process of manufacturing the display panel 1, a sacrifice pattern 18 and a spacer 17 are stacked on the pixel defining layer 13. The sacrifice pattern 18 is located between the spacer 17 and the pixel defining layer 13, and the sacrifice pattern 18 will be removed subsequently (for example, it may be removed by dissolving), so that the spacer 17 may be detached from the display panel 1. The second light-emitting functional layer 24 is formed on sides, away from the base 11, of the first electrode 12, the pixel defining layer 13 and the spacer 17, and the second light-emitting functional layer 24 covers the first electrode 12 and the pixel defining layer 13.

In some embodiments, the second light-emitting functional layer 24 also covers the spacer 17. After the sacrifice pattern 18 and the spacer 17 are removed, or after the sacrifice pattern 18, the spacer 17 and a portion of the second light-emitting functional layer 24 on the spacer 17 are removed, a hollowed-out portion may be formed in the second light-emitting functional layer 24, the hollowed-out portion may be understood as the second hollowed-out portion 140, and the process can be understood as forming the first light-emitting functional layer 14 with the second hollowed-out portion 140 through the second light-emitting functional layer 24.

Referring to FIGS. 3A and 3B, the second light-emitting functional layer 24 covers the pixel defining layer 13, the spacer 17 and the first electrode 12; referring to FIG. 3C, the second light-emitting functional layer 24 covers the pixel defining layer 13 and the first electrode 12; referring to FIGS. 1A to 1G, the first light-emitting functional layer 14 covers the pixel defining layer 13 and the first electrode 12. That is to say, the structure of the second light-emitting functional layer 24 may be different from that of the first light-emitting functional layer 14. Therefore, in the embodiments of the present disclosure, in order to distinguish the structure of the light-emitting functional layer at different periods, the first light-emitting functional layer 14 and the second light-emitting functional layer 24 are used to distinguish, and those skilled in the art can understand that, the first light-emitting functional layer 14 is manufactured through the second light-emitting functional layer, or it can also be understood that the first light-emitting functional layer 14 is at least part of the second light-emitting functional layer 24.

The spacer 17 exists in the manufacturing process of the display panel 1, and it plays the role of supporting the FMM, so that the second light-emitting functional layer 24 may be smoothly manufactured; and after the second light-emitting functional layer 24 is manufactured, the sacrifice pattern 18 is removed, so that the spacer 17 is detached from the display panel 1, and foreign particles, generated by the spacer 17 during the process of removing the FMM, may be removed, thereby providing a good support surface for the subsequent manufacturing of an encapsulation layer.

The sacrifice pattern 18 is removed by, for example, wet etching or dry etching. The wet etching, for example, uses a stripping solution to dissolve the sacrifice pattern 18; and dry etching, for example, uses a gas to react with the sacrifice pattern 18, thereby etching the sacrifice pattern 18.

After the sacrifice pattern 18 is removed, the spacer 17 loses its support, so that the spacer 17 is detached (also referred to as falling off) from the display panel 1.

In the related art, since a material of the spacer 17 is an organic material, when the FMM is used, the FMM may scratch the spacer 17 during the installation or removal of the FMM, thereby generating foreign particles. The density of the spacers 17 and the foreign particles generated by the spacers 17 will affect the quality of a film layer manufactured after the first light-emitting functional layer 14. The film layer manufactured after the first light-emitting functional layer 14 includes, for example, the encapsulation layer. The encapsulation layer includes at least an organic encapsulation sub-layer, and the organic encapsulation sub-layer may be formed by, for example, ink jet printing (IJP). A material of the organic encapsulation sub-layer has certain fluidity, so that the density of the spacers 17 may affect the fluidity of the organic encapsulation sub-layer. For example, in some regions where the density of the spacers 17 is great, the fluidity of the material of the organic encapsulation sub-layer is reduced, thereby forming a portion of the organic encapsulation sub-layers with a large thickness; while in some regions where the density of the spacers 17 is low, the fluidity of the material of the organic encapsulation sub-layer is increased, thereby forming a portion of the organic encapsulation sub-layer with a small thickness. As a result, the thicknesses of different portions of the organic encapsulation sub-layer are different, and the thickness uniformity is poor; moreover, the foreign particles may cause defects in the organic encapsulation sub-layer, which affects the encapsulation effect of the organic encapsulation sub-layer. In addition, due to a height difference of the spacers 17 (for example, in a length direction of the display panel 1, the heights of the spacers 17 on the left and right sides are different), the brightness of the edge of the display panel 1 may be different from that of other areas of the display panel 1, so that the display panel 1 has a color shift phenomenon, and the display effect is affected. Therefore, in the related art, the existence of the spacers 17 may affect the quality of the film layer manufactured after the first light-emitting functional layer 14, and further affect the display effect of the display panel 1.

In the embodiments of the present disclosure, during the manufacturing of the display panel 1, the sacrifice patterns 18 and the spacers 17 are formed on the pixel defining layer 13 to support the FMM, and after the second light-emitting functional layer 24 is manufactured, the spacers 17 is removed by removing the sacrifice pattern 18, so that the first light-emitting functional layer 14 having the second hollowed-out portions 140 is manufactured through the second light-emitting functional layer 24. Therefore, when manufacturing the organic encapsulation sub-layer in the embodiments of the present disclosure, since there is no barrier of the spacers 17, the film thicknesses of the different areas of the manufactured organic encapsulation sub-layer are closer to each other, and the film thickness uniformity is good, and thus the encapsulation effect of the panel 1 may be improved; furthermore, the foreign particles generated by the spacer 17 due to being scratched by the FMM may also be removed, so that the manufactured organic encapsulation sub-layer may not have defects due to the foreign particles, and the quality of the film layer may be good, and thus the encapsulation effect of the display panel 1 may be further improved. Moreover, since there is no spacers 17, the display panel 1 may not have the color shift phenomenon due to the height difference of the spacers 17, so that the display effect of the display panel 1 may be increased; in addition, since there is no spacers 17, a thickness of the display panel 1 may be reduced, so that the display panel 1 with a small thickness may be manufactured, which is more in line with the trend of the display panel 1 developing towards lightness and thinness, and improves the market competitiveness of the display panel 1.

In some embodiments, referring to FIGS. 1A to 1C, 1E and 1F, the orthogonal projection of the second hollowed-out portion 140 on the base 11 and the orthogonal projection of the second opening 1302 on the base 11 have a gap therebetween. In a case there is a gap between the orthogonal projection of the second hollowed-out portion 140 on the base 11 and the orthogonal projection of the second opening 1302 on the base 11, the gap is located in the orthogonal projection of the formed first light-emitting functional layer 14 on the base 11, thereby ensuring that the first light-emitting functional layer 14 is completely covered the first opening 1301, and further ensuring a large contact area between the first light-emitting functional layer 14 and the first electrode 12. If the first light-emitting functional layer 14 does not completely cover the first opening 1301, the first light-emitting functional layer 14 also does not completely cover the portion of the first electrode 12 exposed by the first opening 1301. That is, only a part of the portion of the electrode 12 exposed by the first opening 1301 is covered with the first light-emitting functional layer 14, and the remaining part thereof is not covered by the first light-emitting functional layer 14, so that the contact area between the first light-emitting functional layer 14 and the first electrode 12 is small, resulting in a small light-emitting area of the organic light-emitting diode. In the embodiments of the present disclosure, it is possible to ensure a large contact area between the first light-emitting functional layer 14 and the first electrode 12, thereby ensuring a large light-emitting area of the organic light-emitting diode.

In some embodiments, in a case where an orthogonal projection of the first hollowed-out portion 130 on the base 11 is in a shape of a rectangle, referring to FIGS. 1A to 1G, the length of the first opening 1301 is less than or equal to the length of the second opening 1302.

A length direction of the first opening 1301 and the second opening 1302 is, for example, the length direction of the display panel 1, and the length direction of the display panel 1 is, for example, from left to right or from right to left referring to FIGS. 1A to 1G.

Referring to FIGS. 1A to 1E, the length of the first opening 1301 is equal to the length of the second opening 1302, which is convenient to form the first opening 1301 and the second opening 1302.

Referring to FIGS. 1F and 1G, the length of the first opening 1301 is smaller than the length of the second opening 1302, so that a sidewall of the first hollowed-out portion 130 is an inclined plane, which facilitates the subsequent manufactured first light-emitting functional layer 14 to be attached to the sidewall of the first hollowed-out portion 130. As a result, it is possible to ensure that the first light-emitting functional layer 14 completely covers the at least part of the first electrode 12 exposed by the first opening 1301.

In some embodiments, the maximum size of the first hollowed-out portion 130 is the maximum distance between any two points on a boundary of the orthogonal projection of the first hollowed-out portion 130 on the base 11, and the maximum size of the second hollowed-out portion 140 is the maximum distance between any two points in a boundary of the orthogonal projection of the second hollowed-out portion 140 on the base 11.

For example, the maximum dimension of the first hollowed-out portion 130 is, for example, the maximum length thereof, and the maximum size of the second hollowed-out portion 140 is, for example, the maximum length thereof. Factors affecting the lengths of the first hollowed-out portion 130 and the second hollowed-out portion 140 are analyzed as follows.

Referring to FIGS. 3A to 3C, the length of the second hollowed-out portion 140 is related to the lengths of the sacrifice pattern 18 and the spacer 17.

For example, referring to FIGS. 3A and 3C, the length of the second hollowed-out portion 140 is equal to the length of the sacrifice pattern 18.

For another example, referring to FIG. 3B, the length of the second hollowed-out portion 140 is equal to a length of a surface of the spacer 17 away from the base 11. Therefore, adjusting the length of the second hollowed-out portion 140 may be achieved by changing the length of the sacrifice pattern 18 and/or the surface of the spacer 17 away from the base 11.

On this basis, the maximum size (e.g., the length) of the second hollowed-out portion 140 and the maximum size (e.g., the length) of the first hollowed-out portion 130 have following relationships.

For example, referring to FIGS. 1A, 1D, 1E, 1F and 1G, the length of the second hollowed-out portion 140 is smaller than the length of the first hollowed-out portion 130.

Referring to FIG. 1B, the length of the second hollowed-out portion 140 is equal to the length of the first hollowed-out portion 130.

Referring to FIG. 1C, the length of the second hollowed-out portion 140 is greater than the length of the first hollowed-out portion 130.

In a case where the maximum size of the second hollowed-out portion 140 is smaller than the maximum size of the first hollowed-out portion 130, the overall size of the second hollowed-out portion 140 is relatively small, which facilitates to form the second hollowed-out portion 140 in the first light-emitting functional layer 14, and enable the orthogonal projections of the second hollowed-out portion 140 and the second opening 1302 on the base 11 to have a gap therebetween.

Figure 4A:
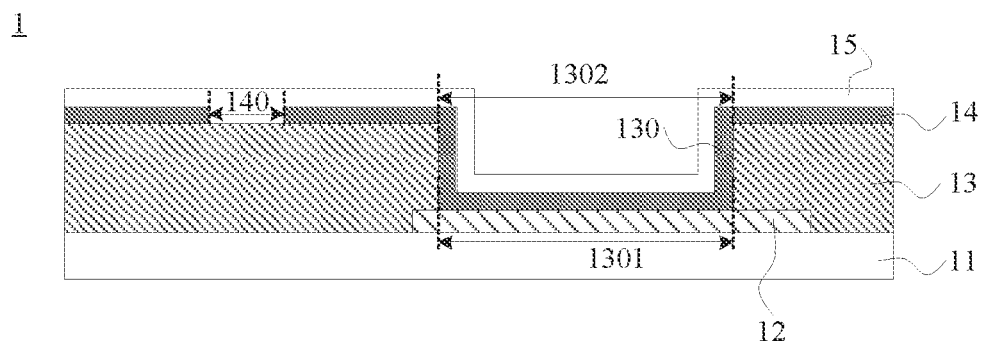
FIGS. 4A and 4B are structural diagrams of other display panels, in accordance with some embodiments of the present disclosure.

In some embodiments, referring to FIG. 4A, the display panel 1 further includes a second electrode 15 disposed on a side of the first light-emitting functional layer 14 away from the base 11. The second electrode 15 covers the second hollowed-out portion 140.

The second electrode 15 covers the second hollowed-out portion 140, that is, a material for forming the second electrode 15 is filled into the second hollowed-out portion 140.

The material of the second electrode 15 is, for example, silver, and the second electrode 15 is, for example, a translucent electrode, so that the light generated by the organic light-emitting diode may exit penetrating the second electrode 15. The first electrode 12 is, for example, an anode, and the second electrode 15 is, for example, a cathode.

Those skilled in the art can understand that, the organic light-emitting diode includes the first electrode 12, the second electrode 15, and a portion, located between the first electrode 12 and the second electrode 15, of the first light-emitting functional layer 14. The organic light-emitting diode may also referred to as a light-emitting device D, and the light emitting device D is used to provide a light source for the display panel 1.

Figure 4B:
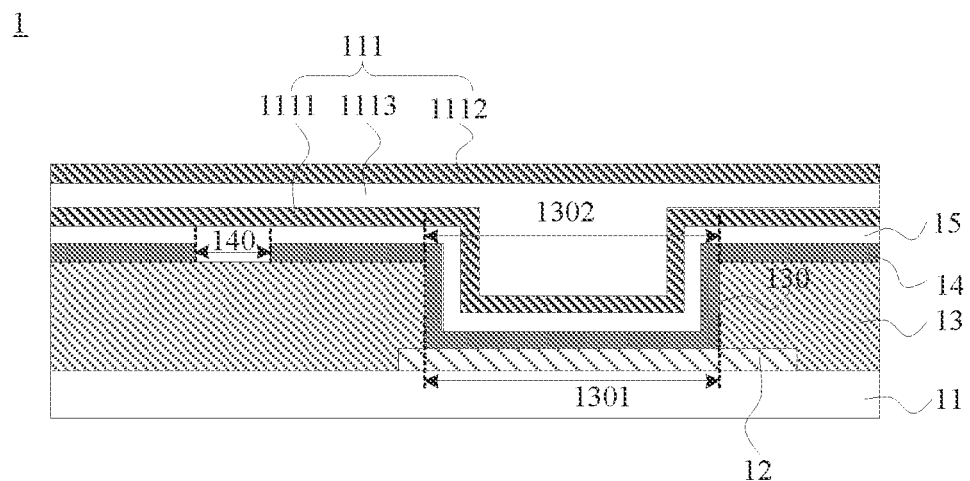

In some embodiments, referring to FIG. 4B, the display panel 1 further includes an encapsulation layer 111. The encapsulation layer 111 includes a first inorganic encapsulation sub-layer 1111, an organic encapsulation sub-layer 1113 and a second inorganic encapsulation sub-layer 1112 that are stacked in the thickness direction of the base 11.

A material of the first inorganic encapsulation sub-layer 1111 and the second inorganic encapsulation sub-layer 1112 is, for example, at least one of silicon nitride or silicon oxide. The first inorganic encapsulation sub-layer 1111 and the second inorganic encapsulation sub-layer 1112 may be formed through, for example, a magnetron sputtering process.

The organic encapsulation sub-layer 1113 is formed by inkjet printing, and in the embodiments of the present disclosure, when the organic encapsulation sub-layer 1113 is formed, the spacer(s) 17 no longer exist in the display panel 1. Therefore, in the process of forming the organic encapsulation sub-layer 1113, the fluidity of the material used for forming the organic encapsulation sub-layer 1113 is good, so that the manufactured organic encapsulation sub-layer 1113 has good film quality and good film thickness uniformity.

Figure 5:
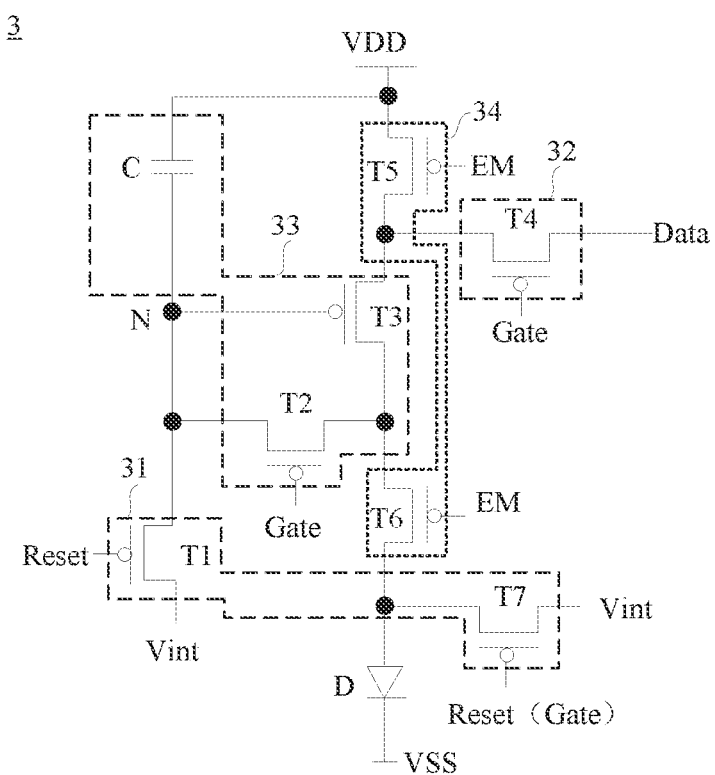
FIG. 5 is a circuit diagram of a pixel driving circuit, in accordance with some embodiments of the present disclosure.

As shown in FIG. 5, some embodiments of the present disclosure provide a pixel driving circuit 3. The pixel circuit 3 includes a reset sub-circuit 31, a data writing sub-circuit 32, a driving sub-circuit 33 and a light-emitting control sub-circuit 34.

The reset sub-circuit 31 is electrically connected to a reset signal terminal Reset, an initialization signal terminal Vint, a node N and the first electrode of the light-emitting device D. In some other embodiments, the reset sub-circuit 31 may further be electrically connected to the gate driving signal terminal Gate. The reset sub-circuit 31 is configured to transmit an initialization signal provided by the initialization signal terminal Vint to the node N to reset the node N under the control of the reset signal terminal Reset; the reset sub-circuit 31 is further configured to transmit the initialization signal provided by the initialization signal terminal Vint to the first electrode of the light emitting device D to reset the first electrode of the light-emitting device D under the control of the reset signal terminal Reset or the gate driving signal terminal.

The data writing sub-circuit 32 is electrically connected to the data signal terminal Data, the gate driving signal terminal Gate and the driving sub-circuit 33. The data writing sub-circuit 32 is configured to write a data signal provided by the data terminal Data into the driving sub-circuit 33 under the control of the gate driving signal terminal Gate.

The driving sub-circuit 33 is electrically connected to the gate driving signal terminal Gate, the node N, the first power voltage signal terminal VDD and the light-emitting control sub-circuit 34. The driving sub-circuit 33 is configured to: under the control is of the gate driving signal, write the data signal and a threshold voltage of a driving transistor into the first node to charge a capacitor C; and under the control of the first power voltage signal terminal VDD and the node N, output a driving signal, for example, a driving current signal, to the light-emitting device D.

The light-emitting control sub-circuit 34 is electrically connected to the first power voltage terminal VDD, the light-emitting control signal terminal EM, the driving sub-circuit 33, and the first electrode of the light-emitting device D. The light-emitting control sub-circuit 34 is configured to: under the control of the light-emitting control signal terminal EM, make a first electrode of the driving transistor electrically to be connected to the first power voltage signal terminal VDD, and make a second electrode of the driving transistor to be electrically connected to the light-emitting device D.

For example, the pixel driving circuit 3 may be a 7T1C pixel driving circuit. The 7T1C pixel driving circuit includes, for example, a first transistor T1, a second transistor T2, a third transistor T3, a fourth transistor T4, a fifth transistor T5, a sixth transistor T6, a seventh transistor T7 and a capacitor C. The third transistor T3 is the driving transistor.

Some or all of the first transistor T1 to the seventh transistor T7 may be, for example, P-type thin film transistors.

For example, the first electrodes of the transistors may be sources, and second electrodes of the transistors may be drains.

As shown in FIG. 5, a gate of the first transistor T1 is electrically connected to the reset signal terminal Reset, the first electrode of the first transistor T1 is electrically connected to the initialization signal terminal Vint, and a second electrode of the first transistor T1 is electrically connected to the node N.

A gate of the second transistor T2 is electrically connected to the gate driving signal terminal Gate, a first electrode of the second transistor T2 is electrically connected to the second electrode of the third transistor T3, and the second electrode of the second transistor T2 is electrically connected to the node N. The second transistor T2 is a compensation transistor, so that a sum of a threshold voltage of the third transistor T3 and the data signal is written into the node N.

A gate of the third transistor T3 is electrically connected to the node N, the first electrode of the third transistor T3 is electrically connected to the second electrode of the fourth transistor T4.

A gate of the fourth transistor T4 is electrically connected to the gate driving signal terminal Gate, and the first electrode of the fourth transistor T4 is electrically connected to the data signal terminal Data.

A gate of the fifth transistor T5 is electrically connected to the light-emitting control signal terminal EM, a first electrode of the fifth transistor T5 is electrically connected to the first power voltage signal terminal VDD, and a second electrode of the fifth transistor T5 is electrically connected to the first electrode of the third transistor T3.

A gate of the sixth transistor T6 is electrically connected to the light-emitting control signal terminal EM, the first electrode of the sixth transistor T6 is electrically connected to the second electrode of the third transistor T3, and the second electrode of the sixth transistor T6 is electrically connected to the first electrode of the light-emitting device D.

A gate of the seventh transistor T7 is electrically connected to the gate driving signal terminal Gate, the first electrode of the seventh transistor T7 is electrically connected to the initialization signal terminal Vint, and the second electrode of the seventh transistor T7 is electrically connected to the first electrode of the light-emitting device D. In some other embodiments, the gate of the seventh transistor T7 may be electrically connected to the reset signal terminal Reset, so as to control the working state of the seventh transistor T7 by the reset signal.

A terminal of the capacitor C is electrically connected to the node N, and another terminal of the capacitor C is electrically connected to the first power voltage signal terminal VDD. For example, one terminal of the capacitor C is a first electrode plate thereof, the other terminal of the capacitor C is a second plate thereof.

A second electrode of the light-emitting device D is electrically connected to a second voltage terminal VSS.

For example, the first power voltage signal terminal VDD is, for example, electrically connected to the first electrode 12 in the display panel 1, and the second power voltage signal terminal VSS is electrically connected, for example, to the second electrode 15 in the display panel 1.

Figure 6:
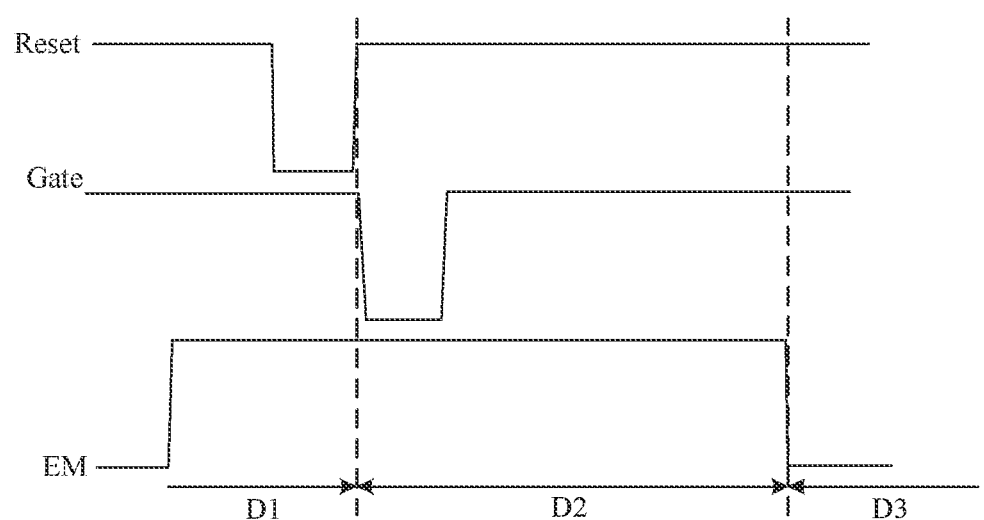
FIG. 6 is a timing diagram of a pixel driving circuit, in accordance with some embodiments of the present disclosure.

Referring to FIGS. 5 and 6, an operation phase of the pixel driving circuit 3 includes a reset phase D1, a data writing phase D2, and a light-emitting phase D3.

In the reset phase D1, under the control of the reset signal terminal Reset, the first transistor T1 is turned on, and the initialization signal provided by the initialization signal terminal Vint is transmitted to the node N to reset the node N.

In a case where the gate of the seventh transistor T7 is electrically connected to the reset signal terminal Reset, under the control of the reset signal terminal Reset, the seventh transistor T7 is turned on, and the initialization signal provided by the initialization signal terminal Vint is transmitted to the first electrode of the light-emitting device D to reset the first electrode of the light-emitting device D.

In the data writing phase D2, under the control of the gate driving signal, the second transistor T2 and the fourth transistor T4 are turned on, and the data signal provided by the data signal terminal Data and the threshold voltage of the third transistor T3 are written into the node N.

In a case where the gate of the seventh transistor T7 is electrically connected to the gate driving signal terminal Gate, under the control of the gate driving signal terminal Gate, the seventh transistor T7 is turned on, and the initialization signal provided by the initialization signal terminal Vint is transmitted to the first electrode of the light-emitting device D to reset the first electrode of the light-emitting device D.

In the light-emitting phase D3, under the control of the light-emitting control signal terminal EM, the fifth transistor T5 and the sixth transistor T6 are turned on; the first electrode of the third transistor T3 is electrically connected to the first power voltage signal terminal VDD by the fifth transistor T5, and the second electrode of the third transistor T3 is electrically connected to the first electrode of the light-emitting device D by the sixth transistor T6, so that the third transistor T3 may drive the light-emitting device D to emit light.

It can be understood by those skilled in the art that in the above process, whether the gate of the seventh transistor T7 is electrically connected to the gate driving signal terminal Gate or the reset signal terminal Reset, when the seventh transistor T7 is turned on, the first electrode of the light-emitting device D may be reset. In a case where the gate of the seventh transistor T7 is electrically connected to the gate driving signal terminal Gate, the gate driving signal is an effective signal in the data writing phase D2, so that the reset process of the light-emitting device D is in the data writing phase D2; while in a case where the gate of the seventh transistor T7 is electrically connected to the reset signal terminal Reset, the reset signal is an effective signal in the reset phase D1, so that the reset process of the light-emitting device D is in the reset phase D1. The two embodiments do not affect the function of the reset sub-circuit 31. Therefore, in the embodiments of the present disclosure, the seventh transistor T7 is included in the reset sub-circuit 31.

Figure 7A:
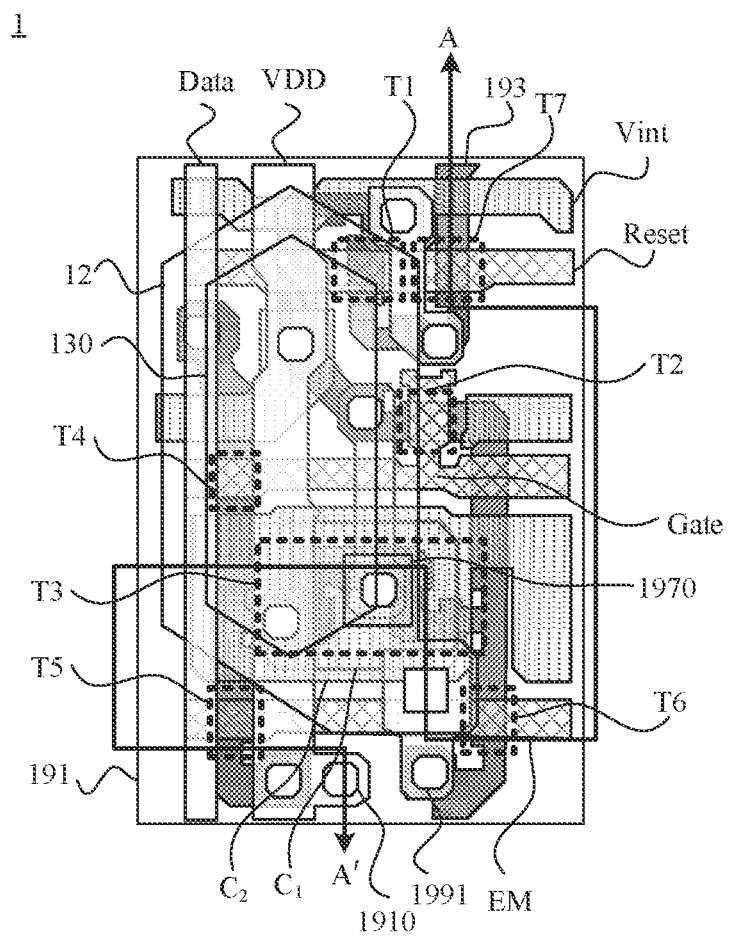
FIG. 7A is a structural diagram of another display panel, in accordance with some embodiments of the present disclosure.

Based on the above, for the specific structures of all thin film transistors (the first transistor T1 to the seventh transistor T7) of the pixel driving circuit 3 in the display panel 1, reference may be made to FIG. 7A in which the gate of the seventh transistor T7 is electrically connected to the reset signal terminal Reset.

The first electrode of the third transistor T3 of the pixel driving circuit 3 is electrically connected to the first electrode 12, and the at least part of the first electrode 12 is exposed by the first hollowed-out portion 130. The gate of the third transistor T3 serves as the first electrode plate $C_1$ of the capacitor C, the second electrode plate $C_2$ and the first electrode plate $C_1$ of the capacitor C are arranged oppositely in the thickness direction of the base 11. The second electrode plate $C_2$ of the capacitor C and the initialization signal line Vint are disposed in the same layer and made of the same material.

For example, the first transistor T1 and the second transistor T2 may be, for example, double-gate thin film transistors, and two gate layers of the double-gate thin film transistor are disposed in the same layer and made of the same material.

Figure 7B:
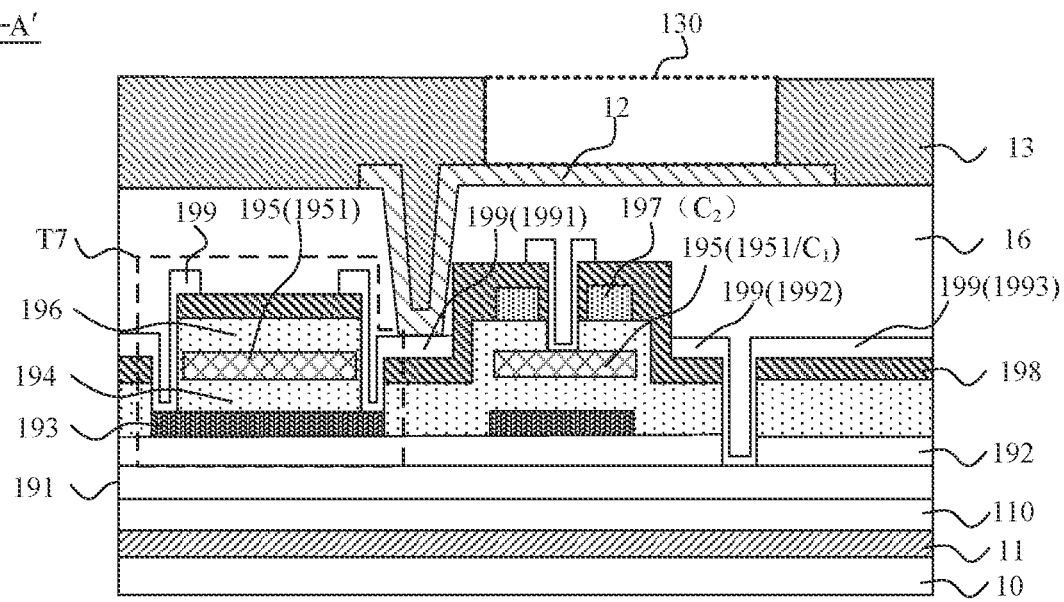
FIG. 7B is a sectional view of FIG. 7A taken along the line A-A'.

For example, as shown in FIG. 7B, in the thickness direction of the base 11, the display panel 1 further includes a first metal layer 191, a buffer layer 192, an active layer 193, a first gate insulating layer 194, a gate metal layer 195, a second gate insulating layer 196, a second metal layer 197, an interlayer insulating layer 198, a third metal layer 199 and a planarization layer 16 that are sequentially moving away from the base 11.

The buffer layer 192, the first gate insulating layer 194, the second gate insulating layer 196 and the interlayer insulating layer 198 are all insulating layers, which play a role of insulation. Materials of these insulating layers are, for example, at least one of silicon oxide or silicon nitride.

Figure 7C:
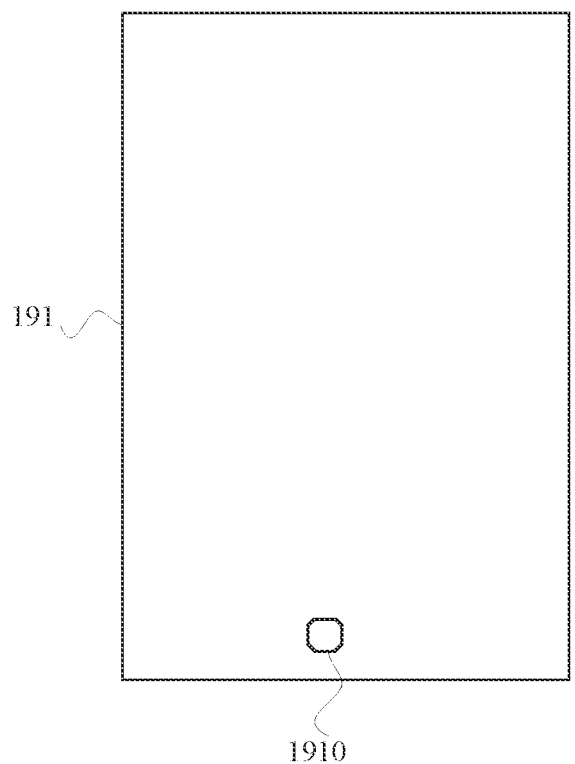
FIG. 7C is a structural diagram of a first metal layer, in accordance with some embodiments of the present disclosure.
Figure 7D:
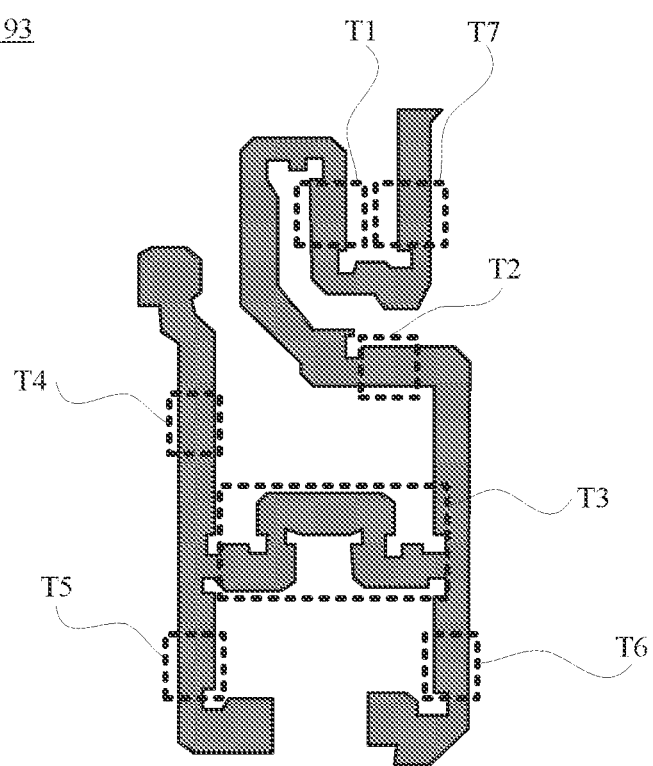
FIG. 7D is a structural diagram of an active layer, in accordance with some embodiments of the present disclosure.

As shown in FIGS. 7A, 7B, and 7D, a portion of each of the active layer 193, the first gate insulating layer 194, the gate layer 1951, the second gate insulating layer 196, the interlayer insulating layer 198, the source 1992 and the drain 1991 constitute the thin film transistor. In some other embodiments, the thin film transistor may further include a portion of the buffer layer 192.

The planarization layer 16 plays a role of planarization, and a material thereof is, for example, an organic material, such as at least one of photoresist and resin.

The first metal layer 191 may serve as a light-shielding layer or a second gate layer of the first transistors T1 to the thin film transistor T7. A material of the first metal layer 191 is, for example, a metal such as silver or aluminum, or an alloy. In a case where the first metal layer 191 severs as the light-shielding layer, the leakage current of the first transistors T1 to the thin film transistors T7 may be reduced; in a case where the first metal layer 191 severs as the second gate layer, the first metal layer 191 needs to be electrically connected to a compensation voltage terminal, and the compensation voltage terminal may provide a compensation voltage signal, and the compensation voltage signal is used to compensate the threshold voltage of the thin film transistor. In the case where the first metal layer 191 serves as the second gate layer, each of the first transistor T1 to the seventh transistor T7 includes at least two gate layers that are arranged oppositely in the thickness direction of the base 11, and any thin film transistor of the first transistor T1 and the second transistor T2, that both including two gate layers disposed in the same layer and made of the same material, has three gate layers.

In a case where the threshold voltage Vth of the thin film transistor deviates from the preset value due to the influence of the manufacturing process of each film layer in the thin film transistor, the deviation value of the threshold voltage Vth may be compensated by the compensation voltage signal provided by the compensation voltage terminal. In a case where the thin film transistor is a P-type transistor, the threshold voltage Vth of the thin film transistor is less than 0, and a voltage of the compensation is voltage signal provided by the compensation voltage terminal is greater than 0. The threshold voltage Vth of the thin film transistor decreases with the increase of the voltage of the compensation voltage signal provided by the compensation voltage terminal. Therefore, when the threshold voltage Vth is larger than the preset value due to process reasons, the compensation may be performed by increasing the voltage of the compensation voltage signal provided by the compensation voltage terminal, so that the larger threshold voltage Vth is reduced to the preset value.

For example, the preset value of the threshold voltage Vth of the thin film transistor is −3.0 V. In a case where the actual value of the threshold voltage Vth is −2.5 V due to process reasons, the threshold voltage Vth is reduced from −2.5 V to −3.0 V by increasing the voltage of the compensation voltage signal provided by the compensation voltage terminal, thereby realizing the function of compensating the threshold voltage of the thin film transistor.

As shown in FIGS. 7A and 7B, the gate metal layer 195 is used to provide the gate layer 1951 of the thin film transistor, a gate line Gate, a reset signal line Vint, and a light-emitting control signal line EM. The gate layer of the driving transistor may also serves as the first electrode plate $C_1$ of the capacitor C. A material of the gate metal layer 195 is, for example, a metal such as silver, aluminum, or molybdenum, or an alloy.

The gate line Gate is electrically connected to the gate driving signal terminal Gate, and is used to provide the gate driving signal terminal Gate with the gate driving signal; the reset signal line Reset is electrically connected to the reset signal terminal Reset, and is used to provide the reset signal terminal Reset with the reset signal; the light-emitting control signal line EM is electrically connected to the light-emitting control signal terminal EM, and is used to provide the light-emitting control signal terminal EM with the light-emitting control signal.

The second metal layer 197 is used to provide an initialization signal line Vint and the second electrode plate $C_2$ of the capacitor C. A material of the second metal layer 197 is, for example, silver, aluminum or molybdenum, an alloy or the like.

As shown in FIGS. 7A and 7B, the third metal layer 199 is used to provide the source 1992 and drain 1991 of the thin film transistor, the data signal line Data, the first power voltage signal line VDD, a compensation voltage signal line 1993 and a connection electrode. The data signal line Data is electrically connected to the data signal terminal Data for providing the data signal for the data signal terminal Data; the first power voltage signal line VDD is electrically connected to the first power voltage signal terminal VDD for providing the first power voltage signal for the first power voltage signal terminal VDD; the compensation voltage signal line is electrically connected to the compensation voltage terminal for providing the compensation voltage terminal with a compensation voltage signal; the connection electrode is used to electrically connect film layer (e.g., the first metal layer 191 and the third metal layer 199) that need to be electrically connected. A material of the second metal layer 197 is, for example, silver, aluminum or molybdenum, an alloy or the like.

For example, referring to FIG. 7C, which is a structural diagram of the first metal layer 191, the first metal layer 191 is provided with a through hole 1910 therein, and the through hole 1910 is used, for example, to electrically connect the first metal layer 191 to the compensation voltage signal line, i.e., to electrically connect the first metal layer 191 to the compensation voltage terminal.

In some embodiments, the voltage provided by the compensation voltage signal line is equal to that of the first power voltage signal provided by the first power voltage signal line VDD. In this case, referring to FIGS. 7A and 7G, the first power voltage signal line VDD is also the compensation voltage signal line, that is, the first power voltage signal line VDD also serves as the compensation voltage signal line.

In some other embodiments, in a case where the voltage provided by the compensation voltage signal line is different from that of the first power voltage signal provided by the first power voltage signal line VDD, the compensation voltage signal line and the first power voltage signal line VDD are two signal lines that are disposed in the same layer and made of the same material.

In the same display panel 1, the voltage of the compensation voltage signal provided by the compensation voltage signal line is a constant value, e.g., equal to the voltage of the power voltage signal. In different display panels, due to the influence of manufacture process, the degree to which the threshold voltages of the thin film transistors in different display panels 1 deviate from the preset values may be different, so that the magnitude of the compensation voltage signals provided by the compensation voltage terminals in different display panels 1 may be different.

In some embodiments, the thin film transistors in the pixel driving circuit are all, for example, P-type transistors, and the first power voltage signal terminal VDD provides, for example, a high constant voltage, so that the operation of the thin film transistor is more stable, and further, the threshold voltage of the thin film transistor is adjusted by the interaction between the active layer and the first metal layer 191.

For example, a material of the active layer 193 is, for example, polysilicon (P-si).

Figure 7E:
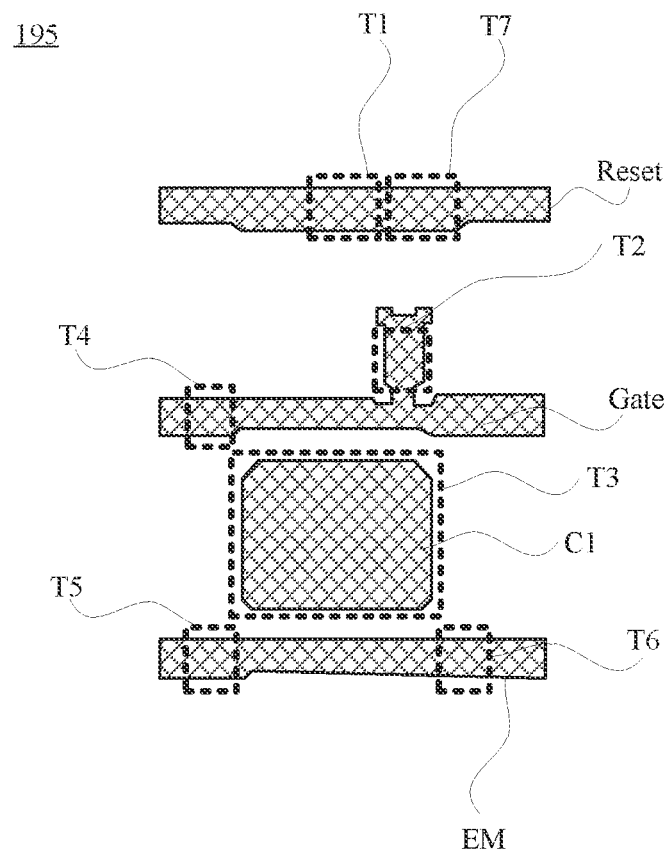
FIG. 7E is a structural diagram of a gate metal layer, in accordance with some embodiments of the present disclosure.

For example, referring to FIG. 7E, which is a structural diagram of the gate metal layer 195, the gate layer of the driving transistor (the third transistor T3) also serves as the first electrode plate $C_1$ of the capacitor C.

Figure 7F:
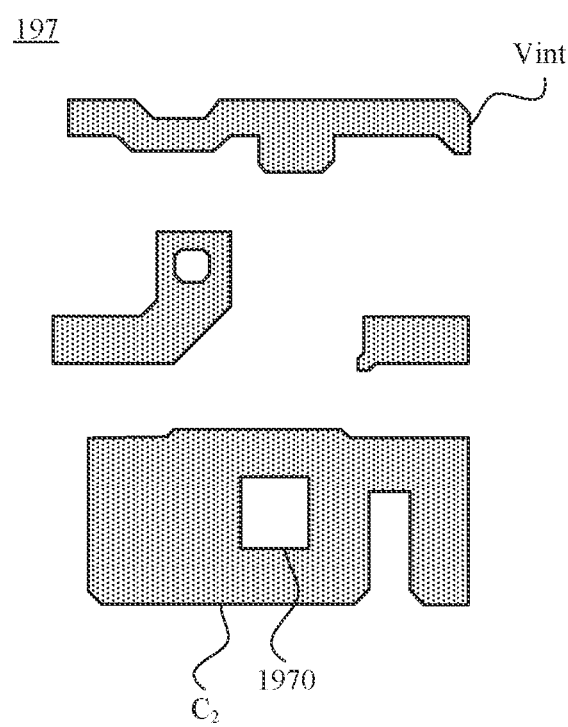
FIG. 7F is a structural diagram of a second metal layer, in accordance with some embodiments of the present disclosure.

For example, referring to FIG. 7F, which is a structural diagram of the second metal layer 197, the second electrode plate $C_2$ of the capacitor C is provided with a through hole 1970 therein, and the through hole 1970 is used to electrically connect the capacitor C to the third metal layer 199.

Figure 7G:
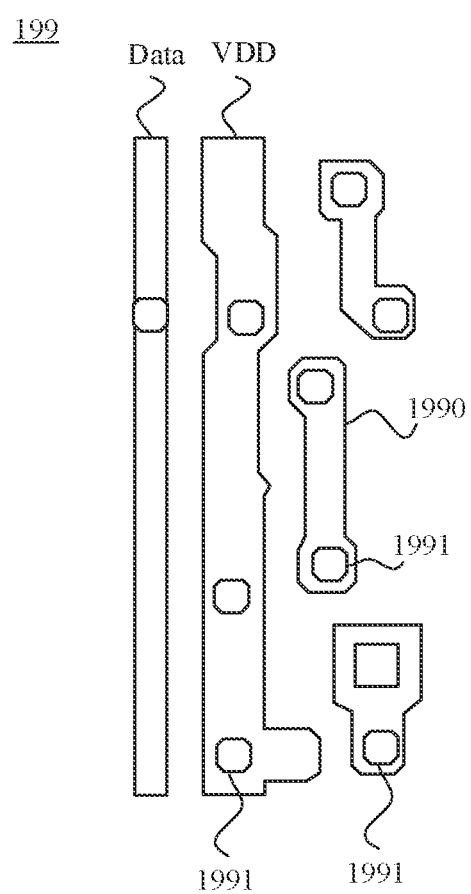
FIG. 7G is a structural diagram of a third metal layer, in accordance with some embodiments of the present disclosure.

For example, referring to FIG. 7G, which is a structural diagram of the third metal layer 199, the first power voltage signal line VDD and the connection electrode 1990 are provided with a through hole 1991 therein for achieving electrical connection between each thin film transistors and signal line(s) (for example, including the data signal line Data, the first power supply voltage signal line VDD, the light-emitting control signal line EM, the gate line Gate, the initialization signal line Vint, etc.). Those skilled in the art can understand that the overlapping parts of both of the data signal line Data and the first power voltage signal line VDD and the thin film transistors serve as the sources or the drains of the thin film transistors.

Figure 7H:
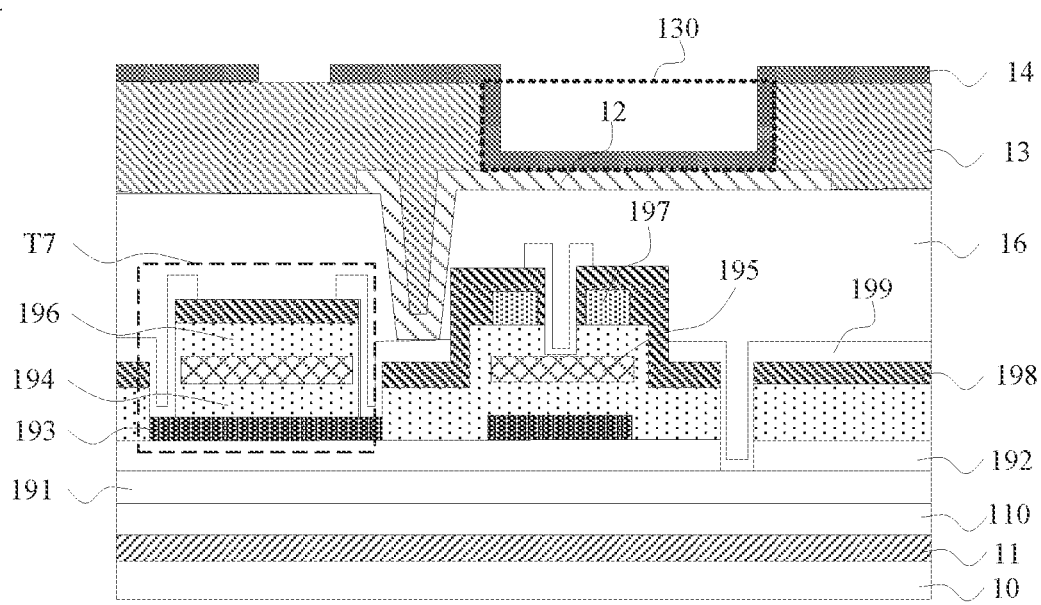
FIG. 7H is a structural diagram of yet another display panel, in accordance with some embodiments of the present disclosure.

In some embodiments, referring to FIGS. 7B and 7H, the display panel 1 further includes a barrier layer 110 disposed on the base 11. The barrier layer 110 is used to isolate the base 11 from the thin film transistors to avoid the influence of substances in the base 11 on the active layer 193 of thin film transistors.

Based on the above, after the first light-emitting functional layer 14 is formed on the pixel defining layer 13 and the first electrode 12, the overall structure of the display panel 1 may be referred to, for example, FIG. 7H.

Referring to FIG. 8A to FIG. 8I, the present disclosure further provides a display substrate 1'. The display substrate 1' includes a base 11, a first electrode 12, a pixel defining layer 13, a sacrifice pattern 18, a spacer 17, and a second light-emitting functional layer 24.

The first electrode 12 is disposed on a side of the base 11.

The pixel defining layer 13 is disposed on the side of the base 11, and includes a first hollowed-out portion 130. The first hollowed-out portion 130 includes a first opening 1301 and a second opening 1302 that are arranged oppositely; the first opening 1301 is closer to the base 11 than the second opening 1302, and the first opening 1301 exposes at least part of the first electrode 12.

For the description of the base 11, the first electrode 12 and the pixel defining layer 13, reference may be made to the description of the base 11, the first electrode 12 and the pixel defining layer 13 in the display panel 1, and will not be repeated.

The sacrifice pattern 18 is disposed on a side of the pixel definition layer 13 away from the base 11, and an orthogonal projection of the sacrifice pattern 18 on the base 11 is non-overlapping with an orthogonal projection of the first opening 1301 on the base 11.

In some embodiments, a material of the sacrifice pattern 18 is, for example, an organic material, such as an organic material containing fluorine.

In some other embodiments, the material of the sacrifice pattern 18 is, for example, a metal material, such as a metal, such as silver (Ag), aluminum (Al), molybdenum (Mo), or titanium (Ti), or an alloy.

The selected material of the sacrifice pattern 18 corresponds to, for example, a stripping liquid, and different materials correspond to different stripping liquids. The selected stripping liquid cannot react with other film layers in the display substrate 1' except for dissolving the sacrifice pattern 18. For example, for the sacrifice pattern 18 of the metal material, an acidic or alkaline stripping solution may be selected; for the sacrifice pattern 18 of a negative photoresist material, hydrofluoroethers may be selected as the stripping solution.

The description that "the orthogonal projection of the sacrifice pattern 18 on the base 11 is non-overlapping with the orthogonal projection of the first opening 1301 on the base 11" includes following cases. Referring to FIGS. 8E and 8I, the orthogonal projection of the sacrifice pattern 18 on the base 11 partially coincides with a border of an orthogonal projection of the first opening 1301 on the base 11; referring to FIGS. 8A to 8D and FIGS. 8F to 8H, there is a gap between the orthogonal projection of the sacrifice pattern 18 on the base 11 and the orthogonal projection of the first opening 1301 on the base 11.

The orthogonal projection of the sacrifice pattern 18 on the base 11 is non-overlapping with the orthogonal projection of the first opening 1301 on the base 11, so as to avoid that a material for forming the second light-emitting functional layer 24 (e.g., light-emitting material) cannot completely cover the at least part of the first electrode 12 exposed by the first opening 1301 due to the blocking of the sacrifice pattern 18.

The spacer 17 is disposed on a side of the sacrifice pattern 18 away from the base 11, and an orthogonal projection of the spacer 17 on the base 11 is non-overlapping with the orthogonal projection of the first opening 1301 on the base 11.

The second light-emitting functional layer 24 is disposed on sides of the pixel definition layer 13 and the first electrode 12 away from the base 11.

A material of the spacer 17 is, for example, an organic material, such as a photosensitive organic material (e.g., a photoresist). In some embodiments, the material of the spacers 17 is a negative photoresist.

Figure 8A:
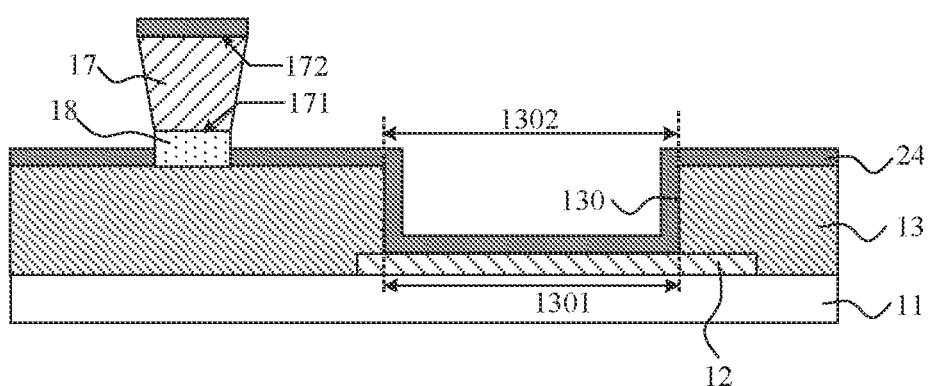
FIGS. 8A to 8I are structural diagrams of display substrates, in accordance with some embodiments of the present disclosure.
Figure 8B:
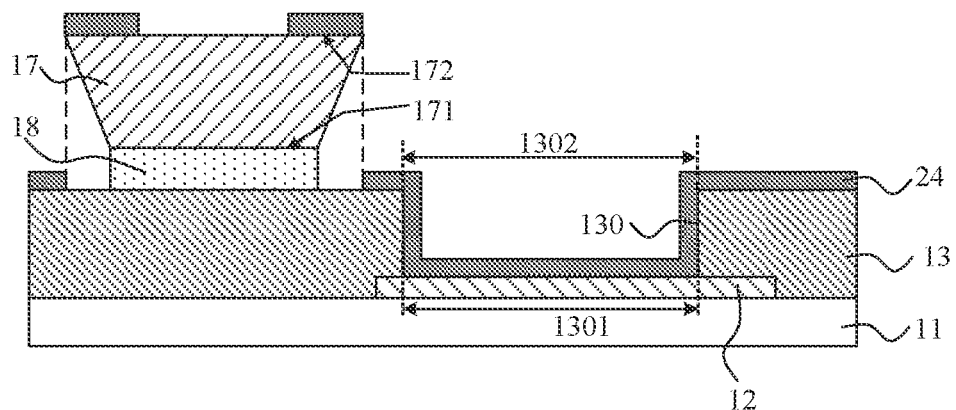
Figure 8C:
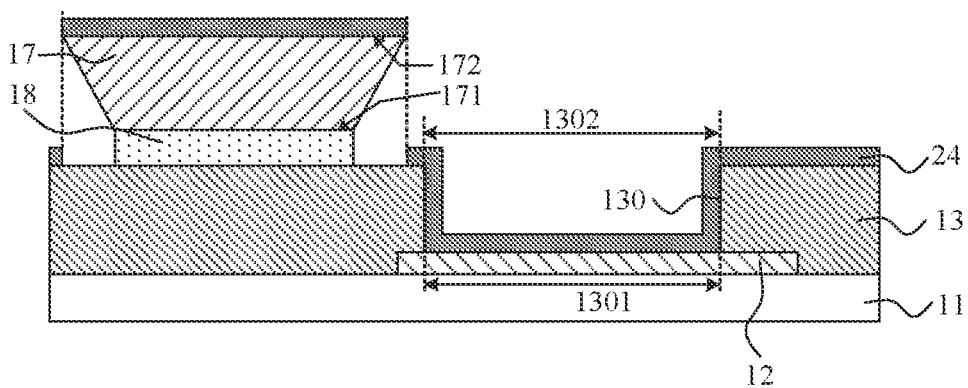
Figure 8D:
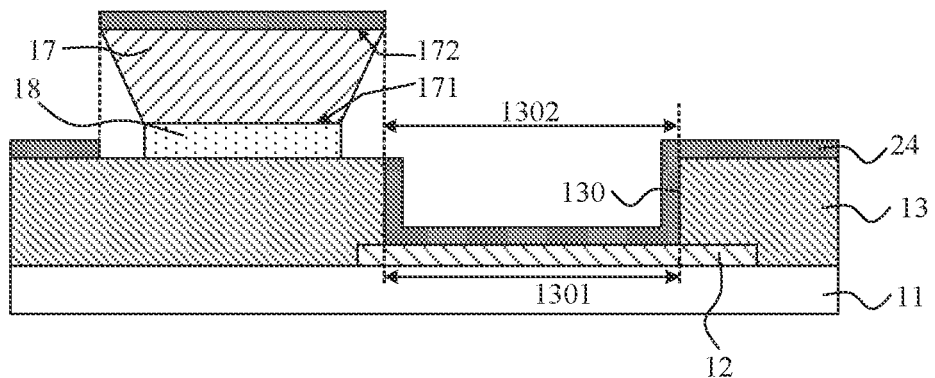
Figure 8E:
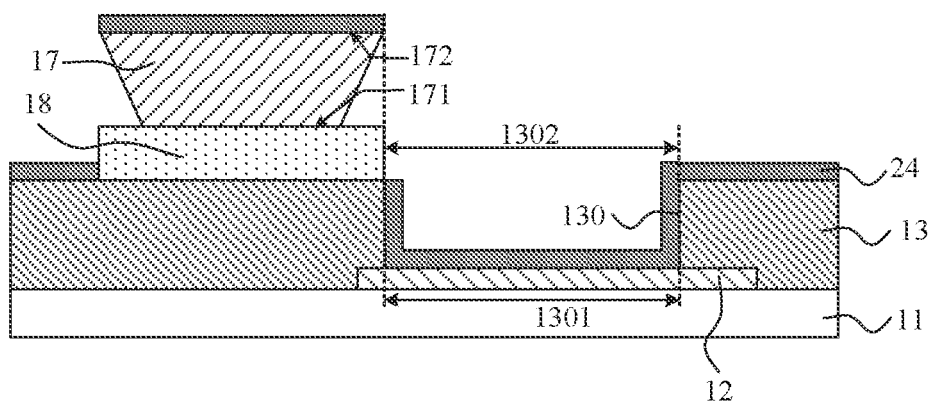
Figure 8F:
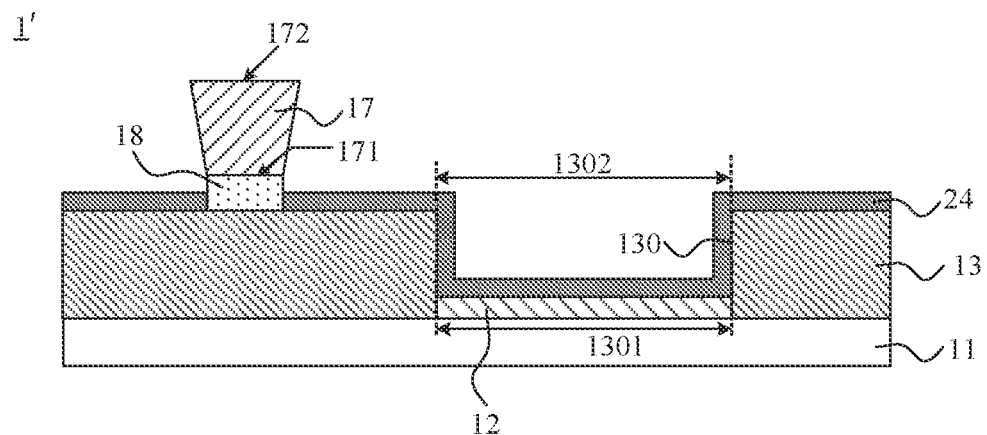
Figure 8G:
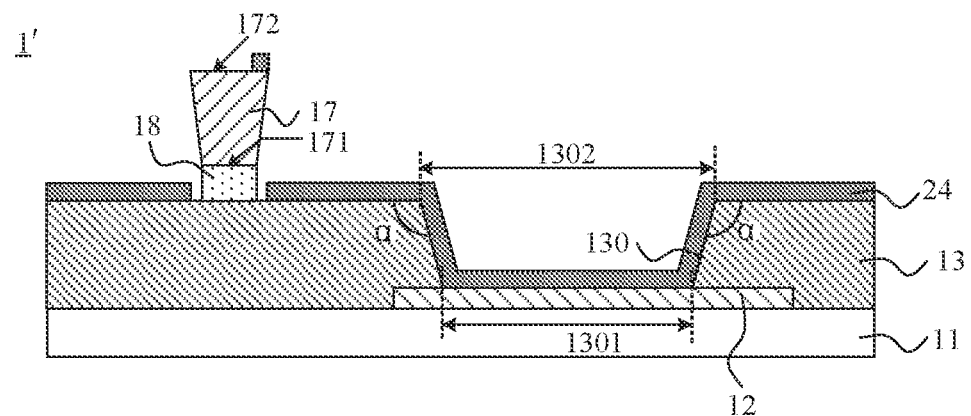
Figure 8H:
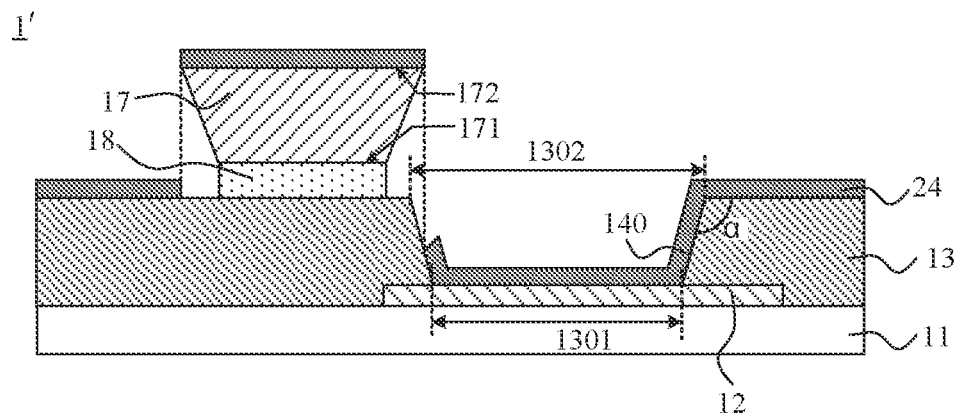
Figure 8I:
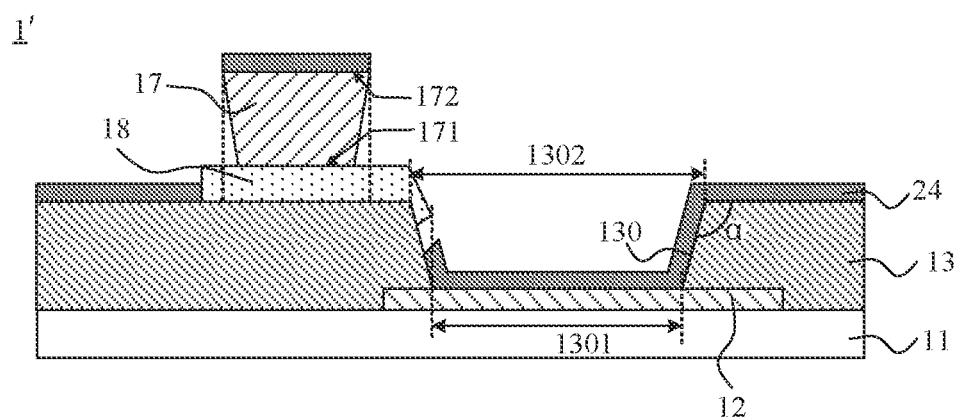

In some embodiments, as shown in FIGS. 8A and 8I, the spacer 17 includes a first surface 171 and a second surface 172 that are arranged oppositely in the thickness direction of the base 11. The first surface 171 is closer to the base 11 than the second surface 172. An orthogonal projection of the first surface 171 on the pixel definition layer 13 is located within an orthogonal projection of the second surface 172 on the pixel definition layer 13, and a border of the orthogonal projection of the first surface 171 on the pixel definition layer 13 and a border of the orthogonal projection of the second surface 172 on the pixel definition layer 13 have a gap therebetween.

In some embodiments, a center of the orthogonal projection of the first surface on the pixel defining layer 13 coincides with a center of the orthogonal projection of the second surface on the pixel defining layer 13.

The orthogonal projection of the first surface on the pixel defining layer 13 is located within the orthogonal projection of the second surface on the pixel defining layer 13, which means that an area of the first surface is smaller than that of the second surface. The first surface is, for example, a lower surface (a surface proximate to the base 11 in the thickness direction of the base 11), and the second surface is an upper surface (a surface away from the base 11 in the thickness direction of the base 11).

Referring to FIGS. 8A to 8I, a longitudinal section of the spacer 17 is, for example, in a shape of an inverted trapezoid, and a length of a bottom base of the inverted trapezoid is smaller than a length of a top base of the inverted trapezoid. In a case where the longitudinal section of the spacer 17 is in the shape of an inverted trapezoid, a three-dimensional structure of the spacer 17 is, for example, a prism, an upper surface and a lower surface opposite to the upper surface of the prism are, for example, in a shape of a rectangle, and an area of the upper surface is larger than an area of the lower surface. Alternatively, the three-dimensional structure of the spacer 17 may be a conical frustum, an upper surface and a lower surface of the conical frustum may be both in a shape of a circle or an ellipse, and an area of the upper surface is larger than an area of the lower surface. In a case where the material of the spacer 17 is the negative photoresist, the spacer 17 with an inverted trapezoidal longitudinal section may be formed by a patterning process (e.g., including exposure, development and etching).

In some other embodiments, the longitudinal section the spacer 17 may also be T-shaped. In a case where the material of the spacer 17 is a metal with two layers of different materials, the T-shaped spacer 17 may be formed according to the principle that the same stripping solution has different etching rates for different metals.

For example, a height of the spacer 17 is, for example, 0.5 μm to 3 μm, inclusive.

In a case where the longitudinal section of the spacer 17 is in the shape of an inverted trapezoid or a T-shaped, the second light-emitting functional layer 24, which is subsequently evaporated on the pixel defining layer 13 and the first electrode 12, disconnect at a sidewall of the spacer 17 and a sidewall of the sacrifice pattern 18, that is, the second light-emitting functional layer 24 do not completely cover the sidewall of the spacers 17 and the sidewall of the sacrifice pattern 18. For example, referring to 8A, the second light-emitting functional layer 24 covers part of the sidewall of the sacrifice pattern 18, and the remaining part of the side wall of the sacrifice pattern 18 is exposed; the second light-emitting functional layer 24 further covers the upper surface of the spacer 17, the sidewall of the spacers 17 are exposed. For another example, referring to FIG. 8B, the second light-emitting functional layer 24 covers part of the upper surface of the spacer 17, and the sidewall of the sacrifice pattern 18 and the sidewall of the spacer 17 are exposed. That the sidewall of the sacrifice patterns 18 is exposed may facilitate the entry of the stripping liquid into the sacrifice patterns 18, so as to rapidly dissolve the sacrifice patterns 18; and that the sidewall of the spacers 17 is exposed may facilitate to remove the spacers 17 subsequently.

It will be noted that, even if the shape of the longitudinal section of the spacer 17 is not inverted trapezoid and T-shaped, and the second light-emitting functional layer 24 covers the sidewalls of the spacer 17 and the sacrifice pattern 18, the stripping liquid may also penetrate through the second light-emitting functional layer 24 into the sacrificial pattern 18, thereby dissolving the sacrifice pattern; after the sacrifice pattern 18 is dissolved, due to the small thickness of the second light-emitting functional layer 24, the stress in the film layer is not enough to block the spacer 17, so that the spacer 17 may still be detached from the display substrate 1'.

The description that "the orthogonal projection of the spacer 17 on the base 11 is non-overlapping with the orthogonal projection of the first opening 1301 on the base 11" includes following cases. Referring to FIGS. 8D and 8E, part, proximate to the first opening 1301, of the border of the orthogonal projection of the spacer 17 on the base 11 coincides with a border of the orthogonal projection of the first opening 1301 on the base 11; referring to FIGS. 8A to 8C and 8F to 8I, the orthogonal projection of the spacer 17 on the base 11 and the orthogonal projection of the first opening 1301 on the base 11 have a gap therebetween.

The orthogonal projection of the spacer 17 on the base 11 is non-overlapping with the orthogonal projection of the first opening 1301 on the base 11, which may ensure that the second light-emitting functional layer 24 completely cover the at least part of the first electrode 12 exposed by the first opening 1301 when the second light-emitting functional layer 24 is evaporated subsequently, thereby ensuring a large contact area between the first electrode 12 and the second light-emitting functional layer 24.

Referring to FIGS. 8A to 8I, the spacer 17 is located on the sacrifice pattern 18, the first surface 171 (a lower surface) of the spacer 17 is in contact with the upper surface of the sacrificial pattern 18, and a length of the first surface of the spacer 17 is less than or equal to a length of the sacrificial pattern 18, and a width of the first surface of the spacer 17 is less than or equal to a width of the sacrificial pattern 18, so as to ensure that the spacer 17 is able to be detached from the display substrate 1' after the sacrifice pattern 18 is removed.

For example, as shown in FIGS. 8A, 8C, 8D, 8E, 8H and 8I, the second light-emitting function layer 24 covers the pixel defining layer 13, the at least part of the first electrode 12 exposed by the first opening 1301 and the spacer 17, and the second light-emitting function layer 24 completely covers the surface (second surface 172) of the spacer 17 away from the base 11.

For another example, referring to FIGS. 8B and 8G, the second light-emitting functional layer 24 covers part of the pixel defining layer 13, the at least part of the first electrode 12 exposed by the first opening 1301 and part of the spacer 17, and the second light-emitting functional layer 24 covers part of the surface (the second surface 172) of the spacer 17 away from the base 11.

Referring to FIG. 8F, the second light-emitting functional layer 24 covers part of the pixel defining layer 13 and the at least part of the first electrode 12 exposed by the first opening 1301, and the second light-emitting functional layer 24 does not cover the surface (second surface 172) of the spacer 17 away from the base 11.

Whether the second light-emitting functional layer 24 covers the second surface of the spacer 17, that is, whether there is a material for forming the second light-emitting functional layer 24 on the second surface of the spacer 17, it depends on the shadow generated by an evaporation opening corresponding to each sub-pixel in the FMM used in evaporating the second light-emitting functional layer 24. In a case where the shadow generated by the evaporation opening extends to the second surface of the spacer 17, the material for forming the second light-emitting functional layer 24 may exist on the second surface of the spacer 17; in a case where the shadow does not extend to the second surface of the spacer 17, there is no material for forming the second light-emitting functional layer 24 on the second surface of the spacer 17.

For the introduction of the material and the structure of the internal layer (i.e., the layer included in the second light-emitting functional layer 24, such as the light-emitting layer) of the second light-emitting functional layer 24, reference may be made to the introduction of the first light-emitting functional layer 14. After the sacrifice pattern 18 and the spacer 17 are removed, the second light-emitting functional layer 24 becomes a first light-emitting functional layer 14. After the sacrifice pattern 18 and the spacer 17 are removed, the structure of the second light-emitting functional layer 24 may or may not be changed. For example, referring to FIG. 8A, the second light-emitting functional layer 24 covers the second surface 172 of the spacer 17, and after the sacrifice pattern 18 and the spacer 17 are removed, part of the second light-emitting functional layer on the second surface of the spacer 17 is also removed, so that the structure of the second light-emitting functional layer 24 is changed. For another example, referring to FIG. 8F, the second light-emitting functional layer 24 does not cover the second surface 172 of the spacer 17, so that after the sacrifice pattern 18 and the spacer 17 are removed, the structure of the second light-emitting functional layer 24 does not change. Therefore, in the embodiments of the present disclosure, regardless of whether the structure of the second light-emitting functional layer 24 is changed after the sacrifice patterns 18 and the spacers 17 are removed, the light-emitting function layer that the sacrifice patterns 18 and the spacers 17 are not removed is referred to as the second light-emitting functional layer 24, and the light-emitting functional layer that the sacrificial pattern 18 and the spacer 17 are removed is referred to as the first light-emitting functional layer 14.

The display substrate 1' in the embodiments of the present disclosure is provided with the sacrifice patterns 18 and the spacers 17, and the spacers 17 are used to support the FMM used when the second light-emitting functional layer 24 is evaporated. After the second light-emitting functional layer 24 is formed, the spacers 17 are detached from the display substrate 1' through removing the sacrifice patterns 18. For the method of removing the sacrifice patterns 18 and the spacers 17, reference may be made to the description of the removal of the sacrifice patterns 18 and the spacers 17 in the display panel 1 above. The structure of the display substrate 1' after the sacrifice patterns 18 and the spacers 17 are removed is the same as that of the display panel 1, and for the advantages of the display substrate 1' after the sacrifice patterns 18 and the spacers 17 are removed, reference may be made to the description in the display panel 1 above, and will not be repeated here.

In some embodiments, referring to FIGS. 8A to 8I, the maximum size of the second surface 172 of the spacer 17 is smaller than the maximum size of the first hollowed-out portion 130. The maximum size of the first hollowed-out portion 130 may be the maximum size of the first opening 1301 or the maximum size of the second opening 1302. For example, if the maximum size of the second opening 1302 is greater than the maximum size of the first opening 1301, the description that "the maximum size of the second surface in the spacer 17 is smaller than the maximum size of the first hollowed-out portion 130" means that the maximum size of the second surface of the spacer 17 is smaller than the maximum size of the second opening 1302. The maximum size of the second surface of the spacer 17 is the maximum distance between any two points on the border of the second surface of the spacer 17, and the maximum size of the second opening 1302 is the maximum distance between any two points on the border of the second opening 1302. In another example, the shape of the second surface of the spacer 17 and the second opening 1302 are both rectangular, then the maximum size of the second surface of the spacer 17 is a length of a diagonal thereof, and the maximum dimension of the second opening 1302 is a length of a diagonal thereof.

In some other embodiments, the second surface of the spacer 17 is, for example, in a shape of a rectangle, and the second opening 1302 is, for example, in a shape of a hexagon.

Since the size of the first hollowed-out portion 130 is at the sub-pixel level, and the maximum size of the second surface of the spacer 17 is smaller than the maximum size of the first hollowed-out portion 130, the size of the spacer 17 is also at the sub-pixel level, so that the size of the spacer 17 may be made small, which facilitates to remove the spacer 17 subsequently through removing the sacrifice pattern 18.

In some embodiments, referring to FIGS. 8A to 8C, 8F and 8G to 8I, the orthogonal projection of the spacer 17 on the base 11 and the orthogonal projection of the second opening 1302 on the base 11 have a gap therebetween. In a case where the orthogonal projection of the spacer 17 on the base 11 and the orthogonal projection of the second opening 1302 on the base 11 have a gap therebetween, the gap is located in an orthogonal projection of the second light-emitting functional layer 24 on the base 11, so as to ensure that the second light-emitting functional layer 24 completely cover the at least part of the first electrode 12 exposed by the first opening 1301. The larger the contact area between the second light-emitting functional layer 24 and the first electrode 12, the larger the light-emitting area of the light-emitting diode.

In some embodiments, referring to FIGS. 8G to 8I, in the case where the first opening 1301 and the second opening 1302 are both in a shape of a rectangle, the length of the first opening 1301 is smaller than the length of the second opening 1302. The length of the first opening 1301 is smaller than the length of the second opening 1302, so that the sidewall of the first hollowed-out portion 130 is an inclined plane, and in turn, an obtuse angle α is formed between a surface away from the base 11 and a sidewall proximate to the first hollowed-out portion 130 of the pixel defining layer 13. The larger the a is, the less likely the second light-emitting layer is cracked at a position of the angle α, and the better the film quality is.

In some embodiments, referring to FIGS. 8A to 8I, a thickness of the sacrifice pattern 18 is greater than a thickness of the second light-emitting functional layer 24. For example, the thickness of the sacrifice pattern 18 is, for example, 0.1 μm to 2 μm, inclusive.

In a case where the thickness of the sacrifice pattern 18 is greater than the thickness of the second light-emitting functional layer 24, part of the sidewall of the sacrifice pattern 18 (in a thickness direction of the sacrifice pattern 18) uncovered by the second light-emitting functional layer 24 is large, which is beneficial to increase a contact area between the sacrifice pattern 18 and the stripping liquid, and reduce the time required to remove the sacrifice pattern 18.

Figure 9A:
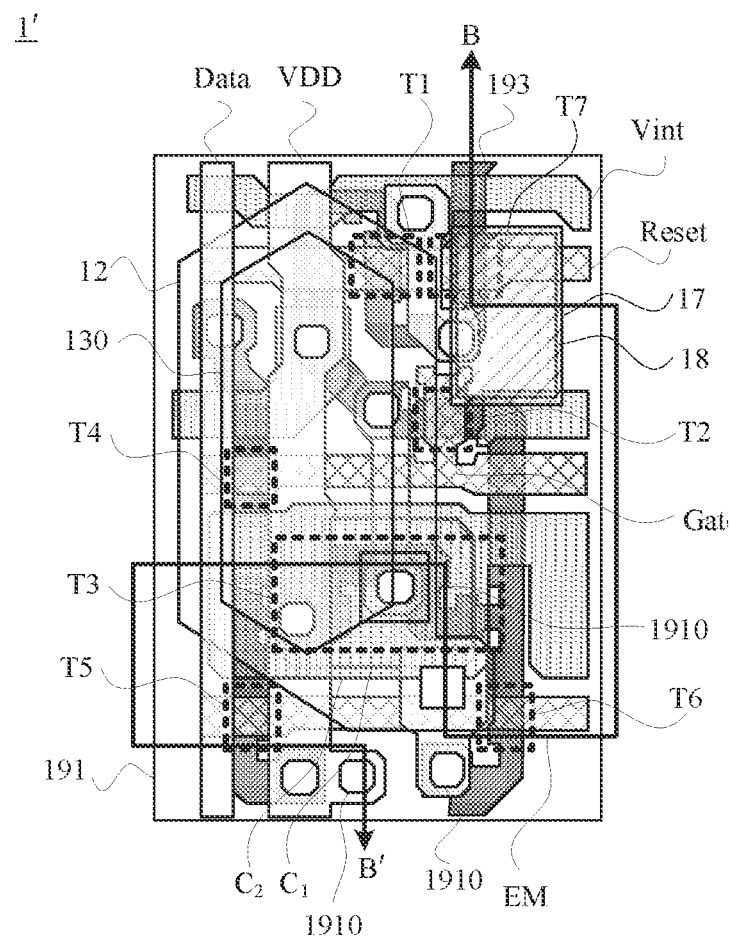
FIG. 9A is a structural diagram of another display substrate, in accordance with some embodiments of the present disclosure.
Figure 9B:
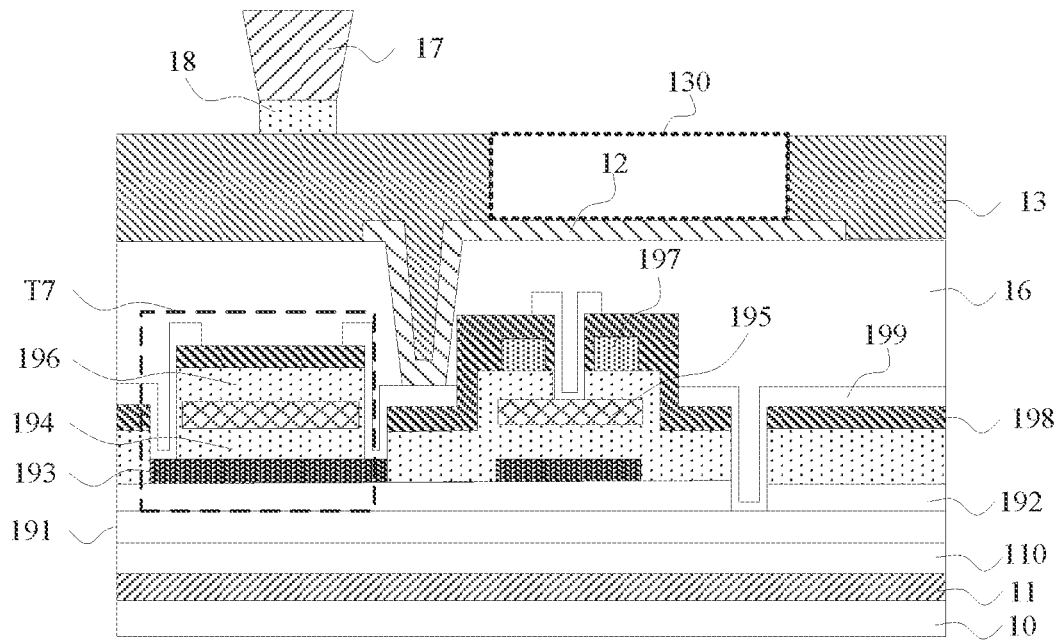
FIG. 9B is a sectional view of FIG. 9A taken along the line B-B'.

In some embodiments, referring to FIGS. 9A and 9B, the display substrate 1' further includes thin film transistors disposed between the base 11 and the first electrode 12, and a source or a drain of the thin film transistor is electrically connected to the first electrode 12.

The structures of the thin film transistors included in the display substrate 1' is the same as the structure of the thin film transistors included in the display panel 1, so reference may be made to the description of the thin film transistors in the display panel 1 above.

Figure 9C:
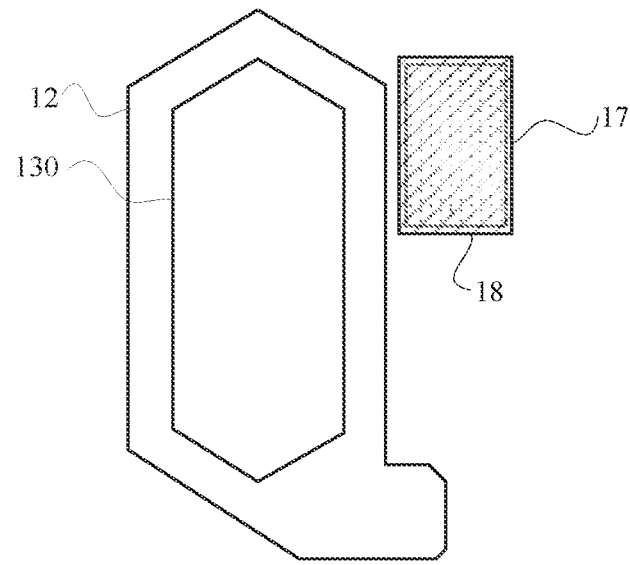
FIG. 9C is a structural diagram of a first electrode, a first hollowed-out portion, a sacrifice pattern and a spacer, in accordance with some embodiments of the present disclosure.

Referring to FIGS. 9A and 9C, the top views of the sacrifice pattern 18 and the spacer 17 are both, for example, in a shape of a rectangle, and the top view of the first hollowed-out portion 130 is, for example, in a shape of a hexagon.

In some other embodiments, referring to FIG. 9B, the display substrate 1' further includes a substrate 10 disposed on a side of the base 11 away from the thin film 1o transistors. The substrate 10 is, for example, a glass substrate. During the manufacturing process of the display substrate 1', the base 11 is formed on the substrate 10.

Figure 9D:
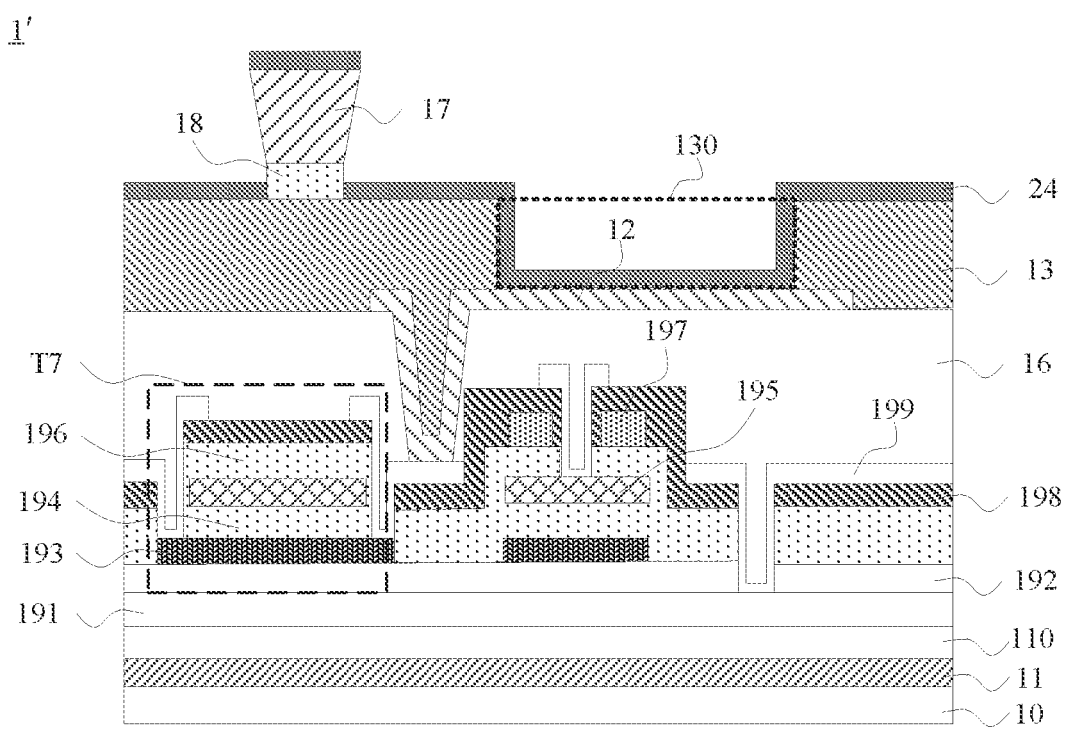
FIG. 9D is a structural diagram of yet another display substrate, in accordance with some embodiments of the present disclosure.

On this basis, after the second light-emitting functional layer 24 is formed on the pixel defining layer 13 and the first electrode 12, the overall structure of the display substrate 1' is, for example, shown in FIG. 9D.

The display panel 1' has the same beneficial effects as the display panel 1, which will not be repeated herein.

Figure 10A:
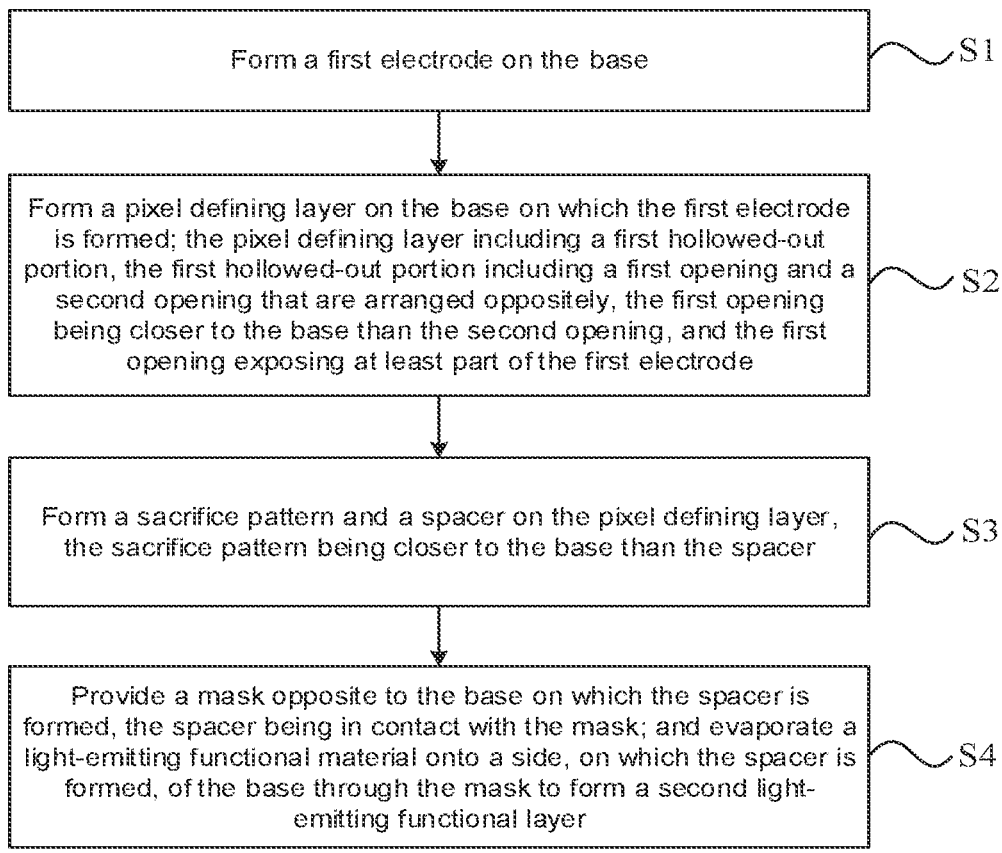
FIG. 10A is a flowchart of a manufacturing method for a display substrate, in accordance with some embodiments of the present disclosure.

Referring to FIG. 10A, embodiments of the present disclosure provide a manufacturing method for a display panel 1'. The method includes following steps (S1 to S4).

Figure 10B:
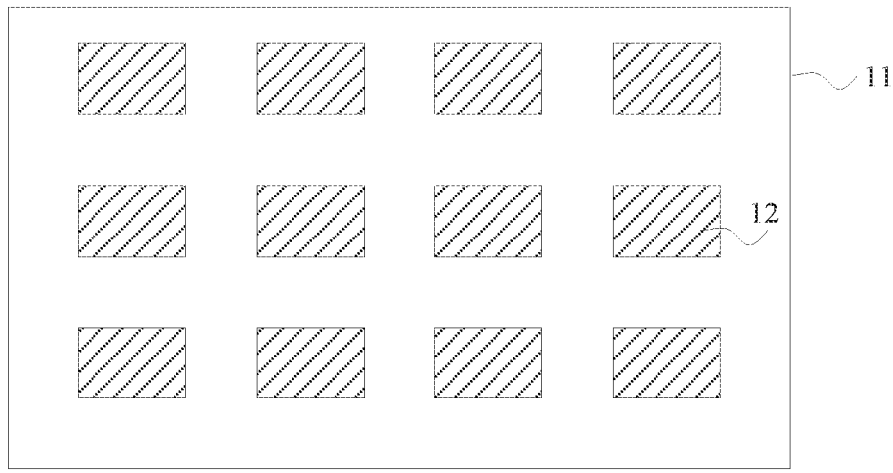
FIGS. 10B to 10G are diagrams illustrating a manufacturing process for a display substrate, in accordance with some embodiments of the present disclosure.

In S1, as shown in FIG. 10B, first electrodes 12 are formed on a base 11.

A material of the second electrodes 12 is ITO. An ITO film is formed on the base 11 firstly, and then the ITO film is manufactured into a plurality of first electrodes 12 by processes such as coating, exposure, development, and etching in a patterning process.

Figure 10C:
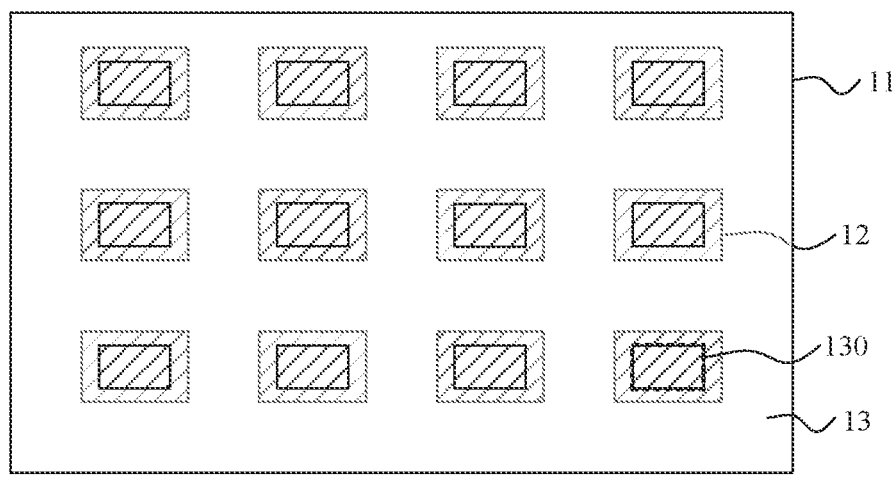

In S2, referring to FIG. 10C, a pixel defining layer 13 is formed on the base 11 on which the first electrode 12 is formed; the pixel defining layer 13 includes first hollowed-out portions 130. The first hollowed-out portion 130 includes a first opening 1301 and a second opening 1302 that are arranged oppositely, and the first opening 1301 is closer to the base 11 than the second opening 1302. The first opening 1301 exposes at least part of the first electrode 12.

An organic film is formed on the first electrodes 12, and the first hollowed-out portions 130 are formed through a patterning process, thereby forming the pixel defining layer 13. A material of the organic film is, for example, polyimide.

Figure 10D:
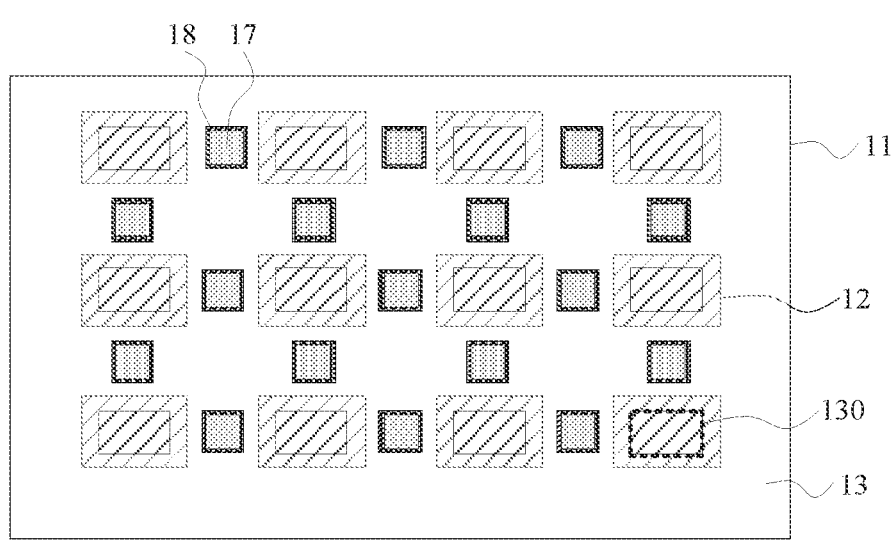
Figure 10E:
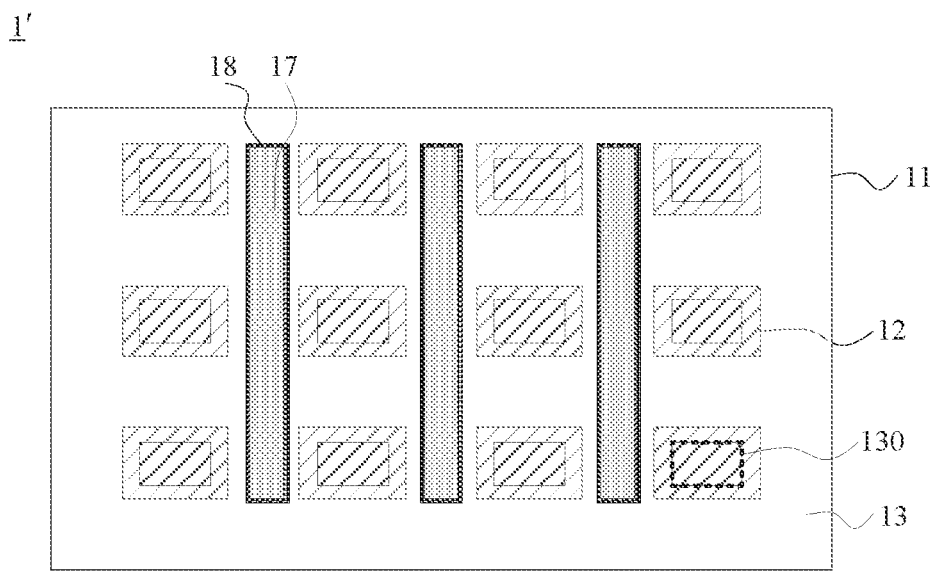
Figure 10F:
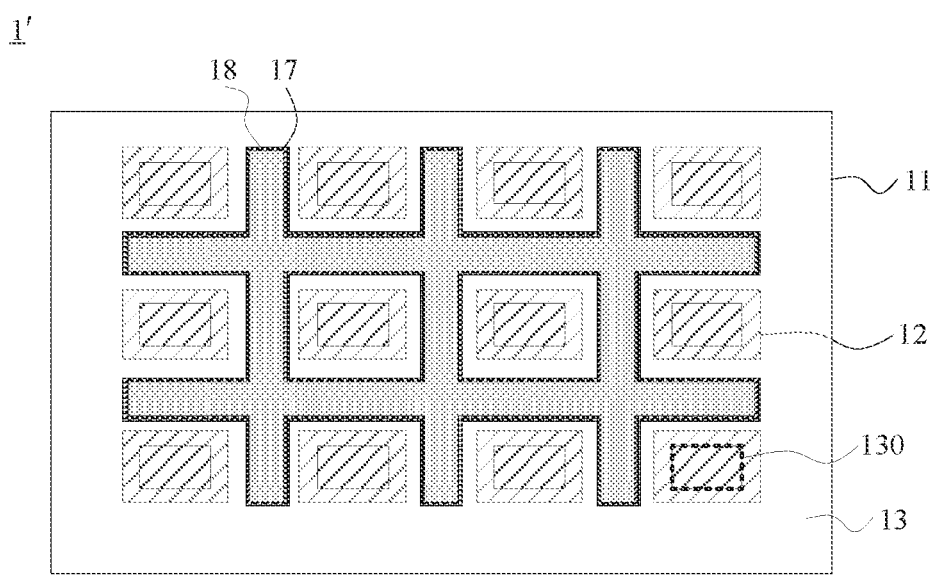

In S3, referring to FIGS. 10D to 10F, a sacrifice pattern 18 and a spacer 17 that are stacked are formed on the pixel defining layer 13, and the sacrifice pattern 18 is closer to the base 11 than the spacer 17.

For example, referring to FIG. 10D, there are a plurality of sacrificial patterns 18 and a plurality of spacers 17, and the sacrifice patterns 18 and the spacers 17 are both small in size; for example, the maximum sizes of the sacrifice patterns 18 and the spacers 17 are both smaller than the maximum size of the hollowed-out portion 130. In this structure, since the size of the spacer 17 is small, it is easier to be detached from the display substrate 1'.

For another example, referring to FIG. 10E, there are a plurality of sacrificial patterns 18 and a plurality of spacers 17, and the sacrifice patterns 18 and spacers 17 are both large in size; for example, the maximum sizes of the sacrifice patterns 18 and spacers 17 are both larger than the maximum size of the first hollowed-out portion 130. In this structure, it is convenient to manufacture the sacrifice patterns 18 and the spacers 17 through a patterning process.

For yet another example, referring to FIG. 10F, there is one sacrifice pattern 18 and one spacer 17, and both the sacrifice pattern 18 and the spacer 17 are large in size; for example, the maximum sizes of the sacrifice pattern 18 and the spacer 17 are both larger than the maximum size of the hollowed-out portion 130. In this structure, the spacer 17 has a good supporting stability for the FMM.

Figure 10G:
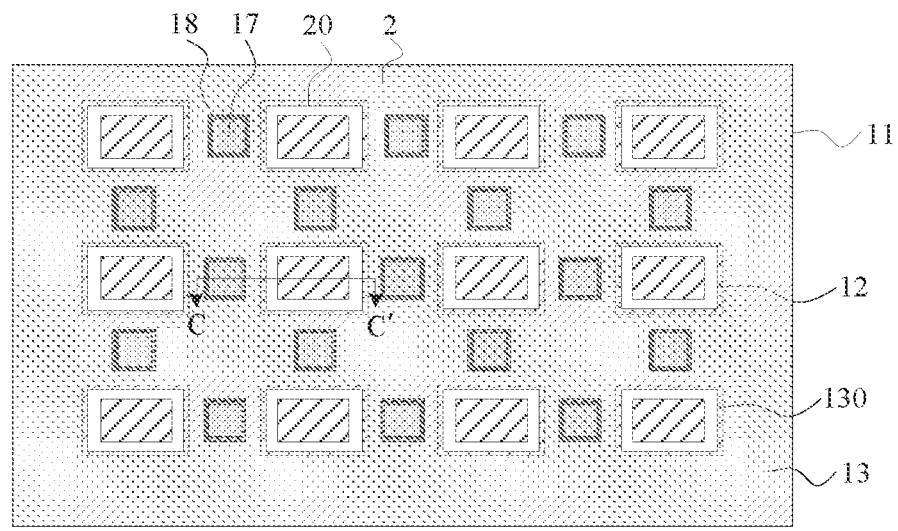
Figure 10H:
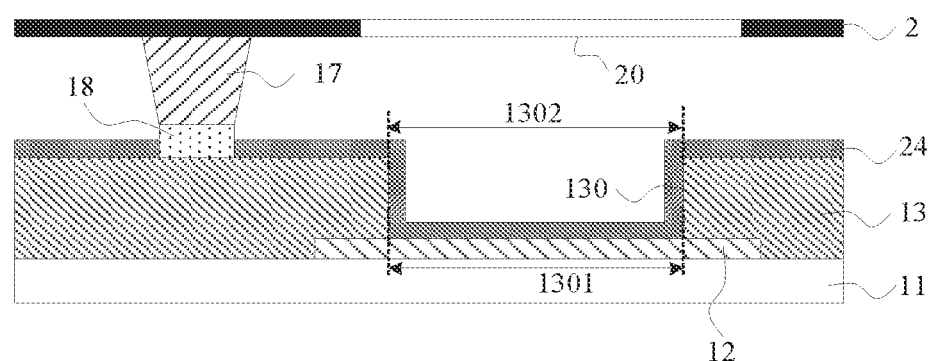
FIG. 10H is a sectional view of FIG. 10G taken along the line C-C'.

In S4, referring to FIGS. 10G and 10H, a mask 2 is provided opposite to the base 11 on which the spacers 17 are formed, and the spacers 17 are in contact with the mask 2. A light-emitting functional material is evaporated onto a side, on which the spacer is formed, of the base 11 through the mask 2 to form a second light-emitting functional layer 24.

The mask 2 is placed opposite to the base 11 on which the spacers 17 are formed, and the spacers 17 are in contact with the mask 2. That is, the mask 2 is placed on a side of the spacer 17 away from the base 11, and the spacer 17 plays the role of supporting the mask 2. The mask 2 is, for example, an FMM. The mask 2 is provided with a plurality of evaporation openings 20 corresponding to the first hollowed-out portions 130 in a one-to-one correspondence. The light-emitting functional material is evaporated onto the first electrodes 12 and the pixel defining layer 13 through the evaporation openings 20 to form the second light-emitting functional layer 24. The light-emitting functional material includes all materials used to form all film layers in the second light-emitting functional layer 24; for example, the light-emitting functional material includes an organic electroluminescent material for forming the light-emitting layer and a material for forming an electron transport layer; the material of the electron transport layer includes, for example, cesium, lithium, silicon monoxide and the like.

Referring to FIGS. 10D to 10F, the difference in the structures of the sacrifice pattern 18 and the spacer 17 is able to affect the structure of the second hollowed-out portion 140 formed after the sacrifice pattern 18 and the spacer 17 are removed. For example, in the structure of the display substrate 1' shown in FIG. 10E, a length of the sacrifice pattern 18 is smaller than a width of the display substrate 1', and after the sacrifice pattern 18 is removed, the structure of the second hollowed-out portion 140 and the structure of the sacrifice pattern 18 are the same or approximately the same, so that a first light-emitting functional layer 14 formed through the second light-emitting functional layer 24 is continuous, and the second hollowed-out portions 140 are disposed in the first light-emitting functional layer 14 at intervals. For another example, referring to FIG. 10E, in a case where the length of the sacrifice pattern 18 is equal to a length of the display substrate 1', after the sacrifice pattern 18 is removed, the first light-emitting functional layer 14, formed through the second light-emitting functional layer 24, is divided into a plurality of unconnected light-emitting functional patterns, and a gap between adjacent light-emitting functional patterns may still be understood as the second hollowed-out portion 140 in the embodiments of the present disclosure.

The manufacturing method for the display substrate 1' has the same beneficial effects as the display substrate 1' described above, and details will not be repeated herein.

In some other embodiments, forming the sacrifice pattern 18 and the spacer 17 that are stacked on the pixel defining layer 13 includes following steps (S300 to S301).

S300, a first film is formed on the base 11 on which the pixel defining layer 13 is formed, and the first film is patterned to form the sacrifice pattern 18 on the side of the pixel defining layer 13 away from the base 11.

For example, in a case where a material of the first film is an organic material containing fluorine, the first film is formed at a low temperature of 90° C. The low temperature is conducive to protecting the characteristics of the organic material, so that the quality of the formed first film is good.

S301, a second film is formed on the base 11 on which the sacrifice pattern 18 is formed, and the second thin film is patterned to form the spacer 17 on the side of the sacrifice pattern 18 away from the base 11.

The difficulty in patterning the sacrifice pattern 18 and the spacer 17 during the manufacturing process of the display substrate 1' above is relatively low.

In some other embodiments, forming the sacrifice patterns 18 and spacers 17 that are stacked on the pixel defining layer 13 includes:

S300', forming a first film on the base 11 on which the pixel defining layer 13 is formed;

S301', forming a second film on the first film; and

S302', patterning the first film and the second film simultaneously to form the sacrifice pattern 18 and the spacer 17 that are stacked.

The patterning process of the sacrifice pattern 18 and the spacer 17 in the manufacturing process of the display substrate 1' above is relatively simple.

Figure 11A:
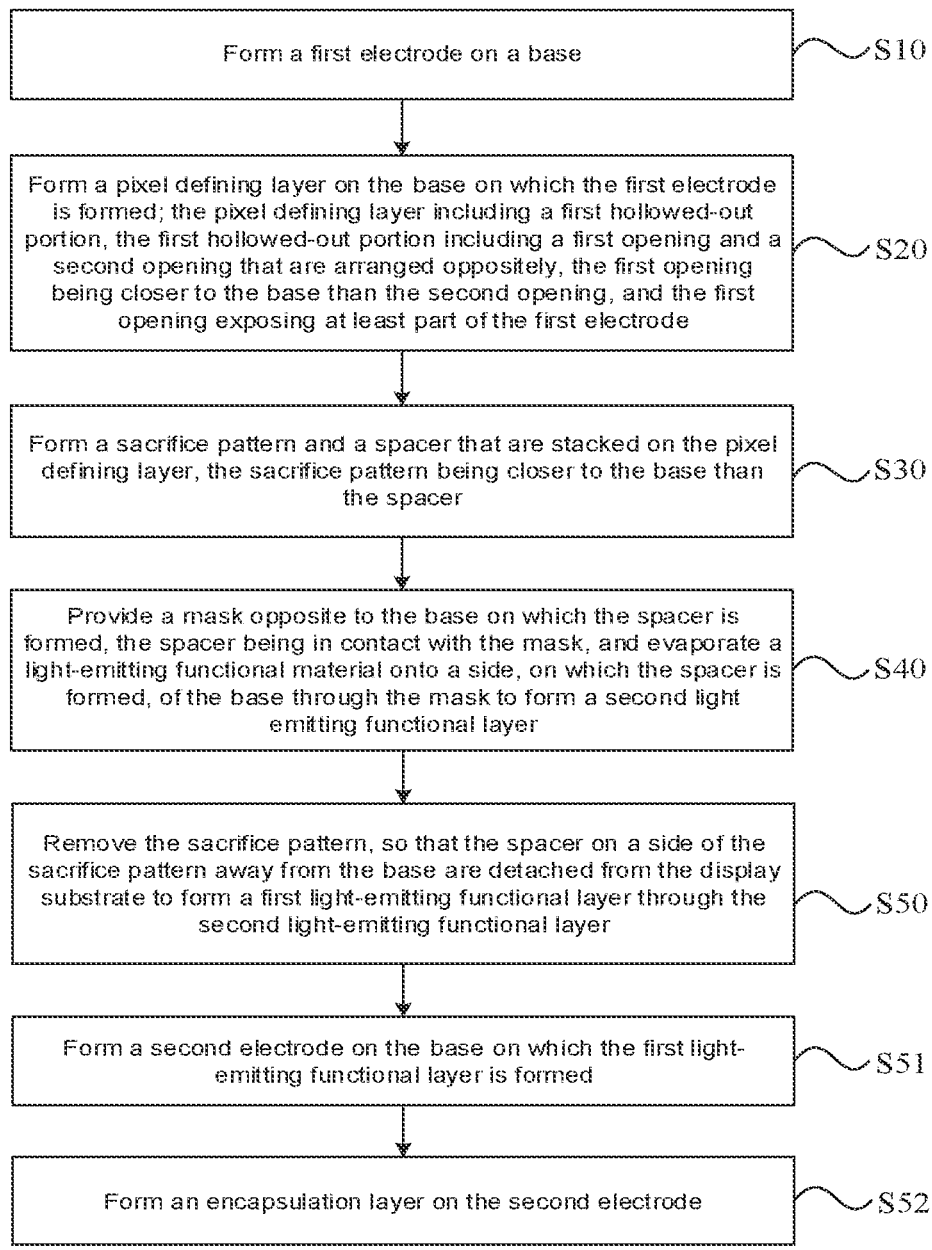
FIG. 11A is a flowchart of a manufacturing method for a display panel, in accordance with some embodiments of the present disclosure.

Referring to FIG. 11A, embodiments of the present disclosure provide a manufacturing method for a display panel 1. The method includes following steps (S10 to S52).

In S10, first electrodes 12 are formed on the base 11.

For a process of forming the first electrodes 12, reference may be made to the process of forming the first electrodes 12 in the display substrate 1' above.

In S20, a pixel definition layer 13 is formed on the base 11 on which the first electrodes 12 are formed; the pixel definition layer 13 includes first hollowed-out portions 130. The first hollowed-out portion 130 includes a first opening 1301 and a second opening 1302 that are arranged oppositely, and the first opening 1301 is closer to the base 11 than the second opening 1302. The first opening 1301 exposes at least part of the first electrode 12.

For the process of forming the pixel definition layer 13, reference may be made to the process of forming the pixel definition layer 13 in the display substrate 1' above.

In S30, a sacrifice pattern 18 and a spacer 17 that are stacked are formed on the pixel defining layer 13. The sacrifice pattern 18 is closer to the base 11 than the spacer 17.

For the process of forming the sacrifice pattern 18 and the spacer 17, reference may be made to the process of forming the sacrifice pattern 18 and the spacer 17 in the display substrate 1' above.

In S40, a mask 2 is provided opposite to the base 11 on which the spacer 17 are formed; the spacer 17 is in contact with the mask 2, a light-emitting functional material is evaporated onto a side, on which the spacer 17 is formed, of the base 11 through the mask 2 to form a second light-emitting functional layer 24.

For the process of forming the second light-emitting functional layer 24, reference may be made to the process of forming the second light-emitting functional layer 24 in the display substrate 1' above.

Figure 11B:
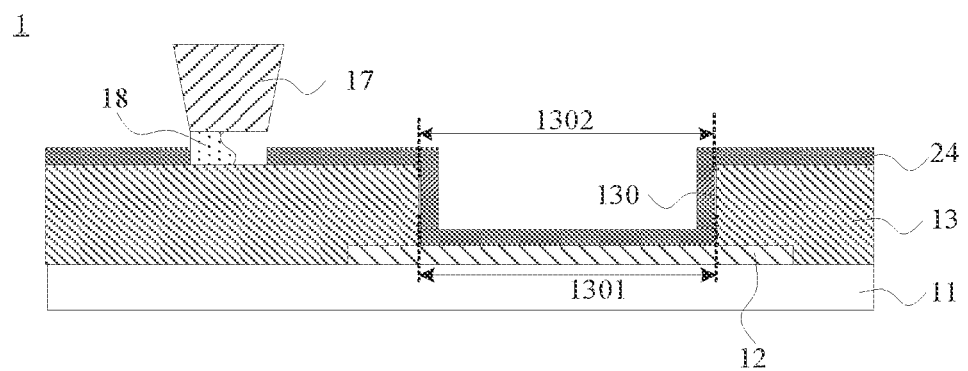
FIG. 11B is a diagram illustrating a process of manufacturing another display panel, in accordance with some embodiments of the present disclosure.

In S50, referring to FIG. 11B, the sacrifice pattern 18 is removed, so that the spacer 17 disposed on the side of the sacrifice pattern 18 away from the base 11 is detached from the display panel 1 to form the first light-emitting functional layer 14 through the second light-emitting functional layer 24.

For example, the sacrifice pattern 18 is dissolved by the stripping solution, so that the spacer 17 falls by itself to achieve the purpose of removing the spacer 17.

The manufacturing process of the display substrate 1' has the same beneficial effects as the display substrate 1' described above, and details will not be repeated herein.

In some embodiments, referring to FIGS. 4A and 11A, the manufacturing method for the display panel 1 further includes:

S51, forming a second electrode 15 on the base 11 on which the first light-emitting functional layer 14 is formed.

In some embodiments, referring to FIGS. 4B and 11A, the manufacturing method for the display panel 1 further includes:

S52, forming an encapsulation layer 111 on the second electrode 15.

Referring to FIG. 4B, forming the encapsulation layer 111 includes, for example:

S520, forming a first inorganic encapsulation sub-layer 1111 on the second electrode 15;

S521, forming an organic sub-encapsulation layer on the first inorganic encapsulation layer 1113; and S522, forming a second inorganic encapsulation layer 1112 on the organic encapsulation layer 1113.

For the description of the first inorganic encapsulation sub-layer 1111, the organic encapsulation layer 111 and the second inorganic encapsulation sub-layer 1112, reference may be made to the above description of the first inorganic encapsulation sub-layer 1111, the organic encapsulation layer 111 and the second inorganic encapsulation 1112 in the display panel 1, which will not be repeated here.

In some embodiments, referring to FIG. 7B, before the first electrode 12 is formed, the manufacturing method for the display panel 1 further includes:

forming a base 11 on a substrate 10; a material of the base 11 being, for example, polyimide.

On this basis, in some embodiments, referring to FIG. 7B, after the base 11 is formed, and before the first electrode 12 is formed, the manufacturing method for the display panel 1 further includes: forming a thin film transistor on the base 11.

For example, at least an active film, a first gate insulating layer 194, a gate metal film, a second gate insulating layer 196 and a third metal film are formed on a side of the base 11, and an active layer 193, a gate layer, a source and a drain are formed by patterning processes to form the thin film transistor.

In the present disclosure, the same reference numerals may be understood as signal terminals, and may also be understood as signal lines and signals. For example, Data may be understood as both the data signal terminal and the data signal lines and the data signal.

It can be understood by those skilled in the art that, for a first electrode corresponds to a sub-pixel in the display substrate, the drawings provided in the embodiments of the present disclosure are only schematic, and the number of the first electrodes shown therein is only schematic, and the number of the first electrodes in the present disclosure is not limited accordingly, and similarly, the number of the plurality of spacers and the plurality of sacrifice patterns shown in the accompanying drawings is not limited accordingly.

It can be understood by those skilled in the art that, the term "same layer" refers to a layer structure formed through a patterning process by using a same mask in which a film layer for forming specific patterns is formed by using a same film forming process.

Depending on different specific patterns, the same patterning process may include exposure, development and etching processes, and the specific patterns in the formed layer structure may be continuous or discontinuous, and these specific patterns may also be at different heights or have different thicknesses.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
   a base;
   a first electrode disposed on a side of the base;
   a pixel defining layer disposed on the side of the base, and including a first hollowed-out portion, wherein the first hollowed-out portion includes a first opening and a second opening that are arranged oppositely, the first hollowed-out portion is closer to the base than the second opening, and the first opening exposes at least part of the first electrode;
   a sacrifice pattern disposed on a side of the pixel definition layer away from the base, an orthogonal projection of the sacrifice pattern on the base being non-overlapping with an orthogonal projection of the first opening on the base;
   a spacer disposed on a side of the sacrifice pattern away from the base, an orthogonal projection of the spacer on the base being non-overlapping with the orthogonal projection of the first opening on the base; and
   a second light-emitting functional layer disposed on sides of the pixel definition layer and the first electrode away from the base;
   wherein the sacrificial pattern is configured to enable the spacer to be detached from the display substrate after the sacrificial pattern being removed.

2. A display panel, the display panel being manufactured through the display substrate according to claim 1, and the display panel comprising:
   the base;
   the first electrode disposed on the side of the base;
   the pixel defining layer disposed on the side of the base, and including the first hollowed-out portion, wherein the first hollowed-out portion includes the first opening and the second opening that are arranged oppositely, the first hollowed-out portion is closer to the base than the second opening, and the first opening exposes at least part of the first electrode; and
   a first light-emitting functional layer disposed on sides of the pixel defining layer and the first electrode away from the base, and including a second hollowed-out portion, wherein an orthogonal projection of the second hollowed-out portion on the base is non-overlapping with the orthogonal projection of the first opening on the base.

3. The display panel according to claim 2, the orthogonal projection of the second hollowed-out portion on the base and the orthogonal projection of the second opening on the base have a gap therebetween.

4. The display panel according to claim 2, a maximum size of the second hollowed-out portion is smaller than a maximum size of the first hollowed-out portion.

5. The display panel according to claim 2, further comprising:
   a second electrode disposed on a side of the first light-emitting functional layer away from the base, the second electrode covering the second hollowed-out portion.

6. The display panel according to claim 2, further comprising:
   a thin film transistor disposed between the base and the first electrode, and including a source and a drain, the source or the drain of the thin film transistor being electrically connected to the first electrode.

7. The display panel according to claim 6, wherein the thin film transistor further includes: a portion of each of an active layer, a first gate insulating layer, a gate layer, a second gate insulating layer and an interlayer insulating layer that are stacked in a direction moving away from the base; the source and the drain of the thin film transistor are arranged on a side of the interlayer insulating layer away from the base, and are in contact with the active layer through via holes passing through the interlayer insulating layer, the second gate insulating layer and the first gate insulating layer.

8. The display panel according to claim 6, further comprising:
   a first metal layer, the first metal layer being disposed between the thin film transistor and the base, wherein the first metal layer is configured to be electrically connected to a compensation voltage terminal, the compensation voltage terminal is configured to provide a compensation voltage signal for compensating a threshold voltage of the thin film transistor.

9. The display panel according to claim 2, further comprising:
   an encapsulation layer, the encapsulation layer including a first inorganic encapsulation sub-layer, an organic encapsulation sub-layer, and a second inorganic encapsulation sub-layer that are stacked in a direction of moving away from the base.

10. A display apparatus, comprising the display panel according to claim 2.

11. The display substrate according to claim 1, wherein the spacer includes a first surface and a second surface that are arranged oppositely in a direction moving away from the base, the first surface is closer to the base than the second surface; an orthogonal projection of the first surface on the pixel-defining layer is located within an orthogonal projection of the second surface on the pixel-defining layer, and a border of the orthogonal projection of the first surface on the pixel defining layer and a border of the orthogonal projection of the second surface on the pixel defining layer have a gap therebetween.

12. The display substrate according to claim 11, wherein a maximum size of the second hollowed-out portion is smaller than a maximum size of the first hollowed-out portion.

13. The display substrate according to claim 1, wherein the orthogonal projection of the spacer on the base and an orthogonal projection of the second opening on the base have a gap therebetween.

14. The display substrate according to claim 1, wherein a thickness of the sacrifice pattern is greater than a thickness of the second light-emitting functional layer.

15. The display substrate according to claim 1, further comprising:
   a thin film transistor disposed between the base and the first electrode, and including a source and a drain, the source or the drain of the thin film transistor being electrically connected to the first electrode.

16. A manufacturing method for a display substrate, comprising:
   forming a first electrode on a base;
   forming a pixel defining layer on the base on which the first electrode is formed; wherein the pixel defining layer includes a first hollowed-out portion, the first hollowed-out portion includes a first opening and a second opening that are arranged oppositely, the first opening is closer to the base than the second opening, and the first opening exposes at least part of the first electrode;
   forming a sacrifice pattern and a spacer that are stacked on the pixel defining layer, the sacrifice pattern being closer to the base than the spacer; wherein the sacrificial pattern is configured to enable the spacer to be detached from the display substrate after the sacrificial pattern being removed;
   providing a mask opposite to the base on which the spacer is formed, the spacer being in contact with the mask; and
   evaporating a light-emitting functional material onto a side, on which the spacer is formed, of the base through the mask to form a second light-emitting functional layer.

17. The manufacturing method for the display substrate according to claim 16, forming the sacrifice pattern and the spacer that are stacked on the pixel defining layer including:
   forming a first film on the base on which the pixel defining layer is formed;
   patterning the first film to form the sacrifice pattern on a side of the pixel defining layer away from the base;
   forming a second film on the base on which the sacrifice pattern is formed, and
   patterning the second film to form the spacer on a side of the sacrifice pattern away from the base.

18. A manufacturing method for a display panel, comprising:
   the manufacturing method for the display substrate according to claim 16, and
   removing the sacrifice pattern in the display substrate, so that the spacer, located on a side of the sacrifice pattern away from the base, in the display substrate is detached from the display substrate to form a first light-emitting functional layer through the second light-emitting functional layer.

19. The manufacturing method for the display panel according to claim 18, further comprising:
   forming a second electrode on the base on which the first light-emitting functional layer is formed;
   forming a first inorganic encapsulation sub-layer on the second electrode;
   forming an organic encapsulation sub-layer on the first inorganic encapsulation; and
   forming a second inorganic encapsulation sub-layer on the organic encapsulation sub-layer, the first inorganic encapsulation sub-layer, the organic encapsulation sub-layer and the second inorganic encapsulation sub-layer constituting an encapsulation layer.

20. The manufacturing method for the display substrate according to claim 16, forming the sacrifice pattern and spacer that are stacked on the pixel defining layer including:
   forming a first film on the base on which the pixel defining layer is formed;
   forming a second film on the first film; and
   patterning the first film and the second film simultaneously to form the sacrifice pattern and the spacer that are stacked.

* * * * *